(12) United States Patent
Joyner et al.

(10) Patent No.: US 7,129,100 B2
(45) Date of Patent: Oct. 31, 2006

(54) IN-WAFER TESTING OF INTEGRATED OPTICAL COMPONENTS IN PHOTONIC INTEGRATED CIRCUITS (PICS)

(75) Inventors: Charles H. Joyner, Sunnyvale, CA (US); Frank H. Peters, San Jose, CA (US)

(73) Assignee: Infinera Corporation, Sunnyvale, CA (US)

( * ) Notice: Subject to any disclaimer, the term of this patent is extended or adjusted under 35 U.S.C. 154(b) by 0 days.

(21) Appl. No.: 11/014,407

(22) Filed: Dec. 16, 2004

(65) Prior Publication Data

US 2005/0105843 A1    May 19, 2005

Related U.S. Application Data

(62) Division of application No. 10/385,574, filed on Mar. 10, 2003, now Pat. No. 7,006,719.

(60) Provisional application No. 60/362,757, filed on Mar. 8, 2002.

(51) Int. Cl.
*H01L 21/00* (2006.01)
(52) U.S. Cl. .................................................. 438/14
(58) Field of Classification Search ................ 438/5–7, 438/14, 16, 22, 26–32, 34–36, 110, 113–114, 438/460–464; 385/3–5, 8–9, 11–12, 14–15, 385/25–28, 31–32, 37, 39, 42, 122, 129, 385/130
See application file for complete search history.

(56) References Cited

U.S. PATENT DOCUMENTS 5,147,825 A * 9/1992 Koch et al. ................. 438/507
5,206,920 A * 4/1993 Cremer et al. ............... 385/37
5,394,489 A * 2/1995 Koch ........................... 385/14
5,530,580 A   6/1996 Thompson et al. ......... 359/248
5,550,666 A   8/1996 Zirngibl ..................... 359/125
5,809,184 A * 9/1998 Doerr et al. ................. 385/11
5,991,322 A * 11/1999 Takiguchi et al. ........ 372/50.11
6,137,939 A   10/2000 Henry et al. ............... 385/132
6,400,855 B1   6/2002 Li et al. ......................... 385/4
6,473,541 B1   10/2002 Ho ............................... 385/15
6,490,395 B1   12/2002 Nara et al. .................... 385/39
6,640,034 B1 * 10/2003 Charlton et al. ............ 385/122
6,701,090 B1   3/2004 Hatayama et al. ............ 398/79
6,922,422 B1 * 7/2005 Peters et al. ................. 372/36
2002/0060316 A1   5/2002 Matsuyama .................. 287/12
2002/0110308 A1   8/2002 Kunkee et al. ............... 385/14
2002/0181871 A1   12/2002 Saito et al. ................... 385/39
2002/0197016 A1   12/2002 Chandrasekhar et al. ..... 385/50

OTHER PUBLICATIONS

U.S. Appl. No. 11/014,410, Filed Dec. 16, 2004, Peters et al., Companion Divisonal.
S Ménézo et al., "10-Wavelength 200-GHz Channel Spacing Emitter Integrating DBR Lasers with a PHASAR on InP for WDM Applications", *IEEE Photonics Technology Letters*, vol. 11(7), pp. 785-787, Jul. 1999.
J. H. den Besten et al., "Low-Loss, Compact, and Polarization Independent PHASAR Demultiplexer Fabricated by Using a Double-Etch Process", *IEEE Photonics Technology Letters*, vol. 14(1), pp. 62-64, Jan. 2002.
Philip Garrou, "GaAs IC Makers Lead the Way in Metals and Low-k Dielectrics", *Compound Semiconductor*, pp. 57-59, Jul. 2002.

* cited by examiner

*Primary Examiner*—Michael Lebentritt
*Assistant Examiner*—Andre' Stevenson
(74) *Attorney, Agent, or Firm*—W. Douglas Carothers, Jr.

(57) ABSTRACT

Disclosed is a method of in-wafer testing of integrated optical components and in-wafer chips with photonic integrated circuits (PICs).

7 Claims, 13 Drawing Sheets

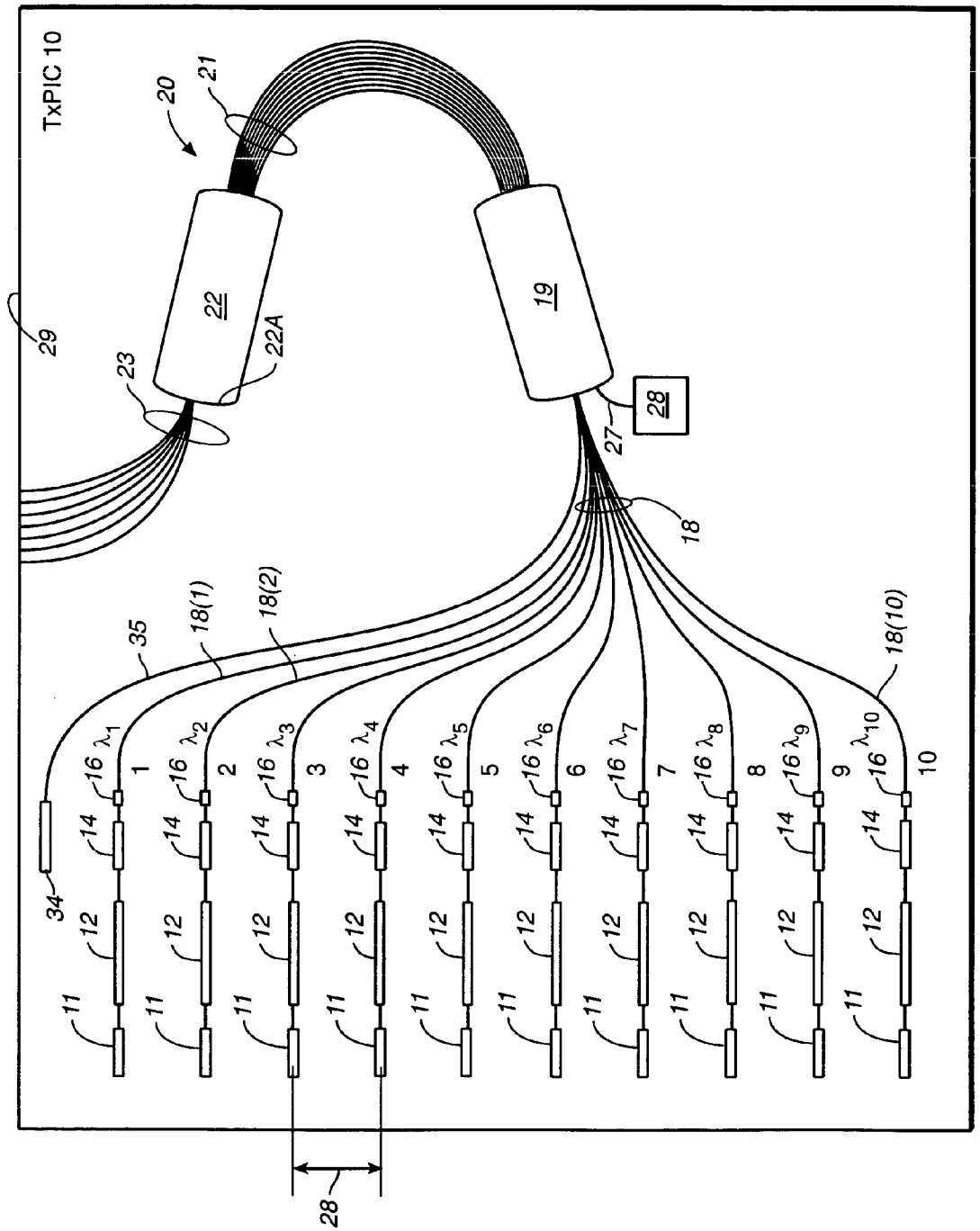
FIG._1

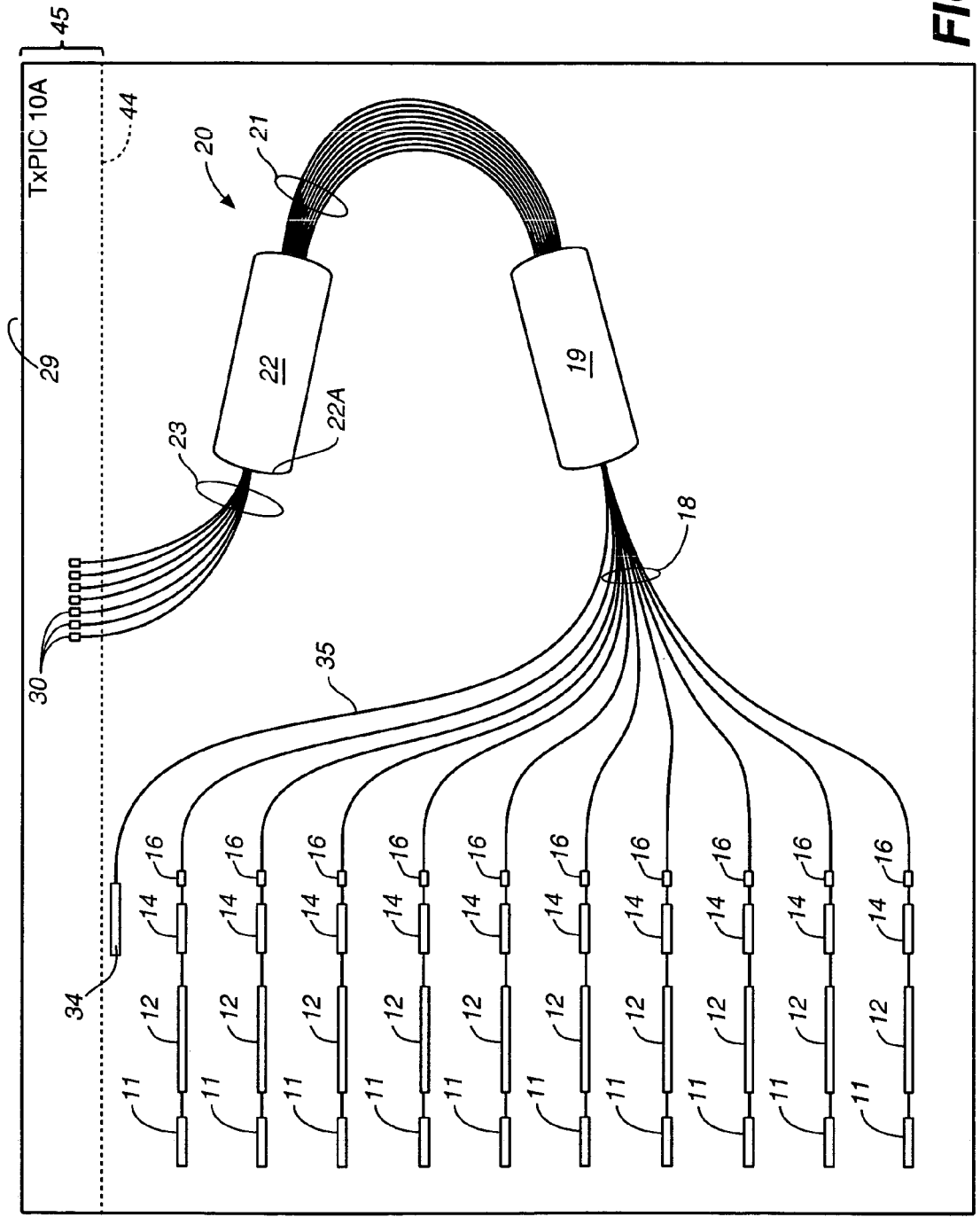
FIG._2

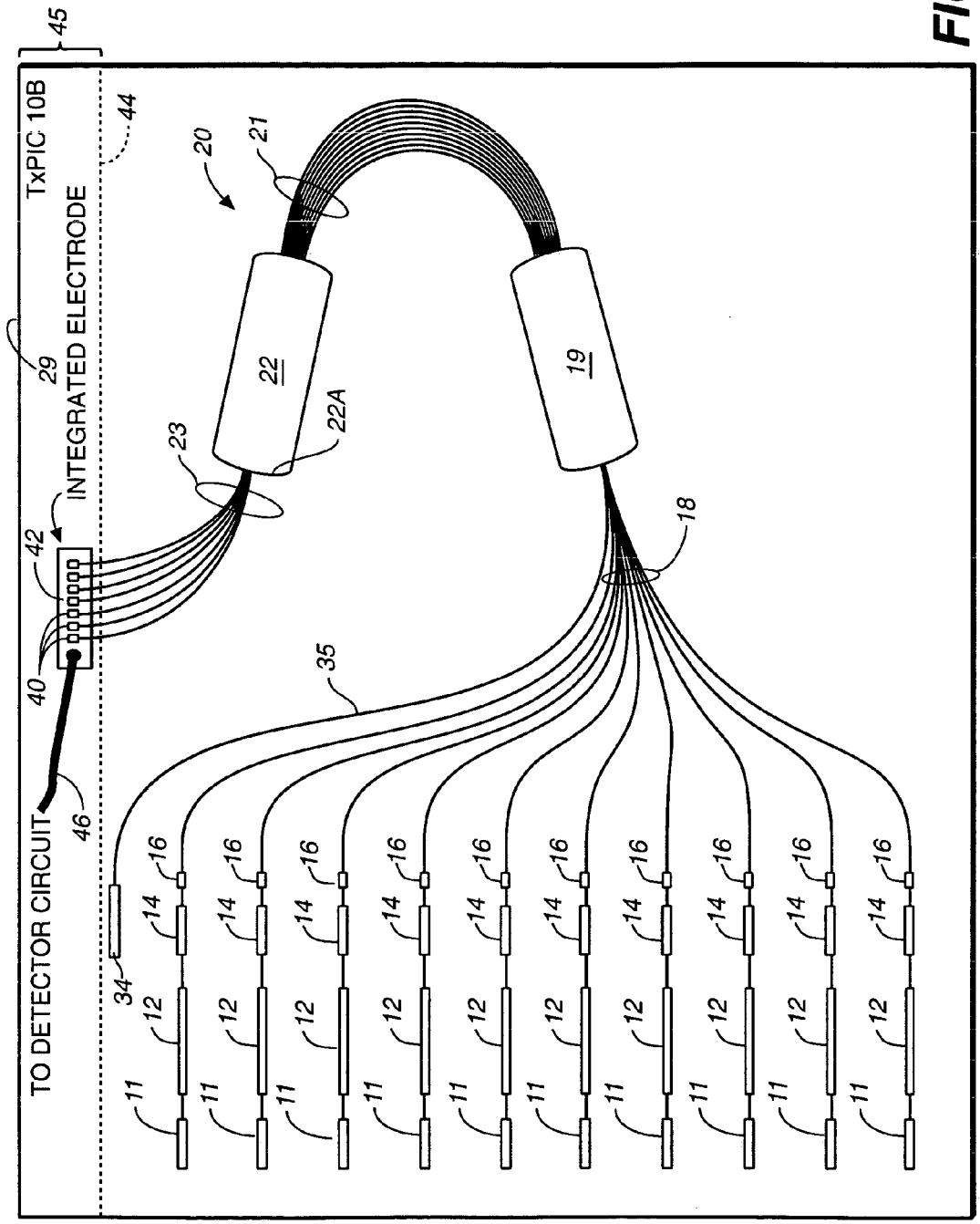
FIG._3

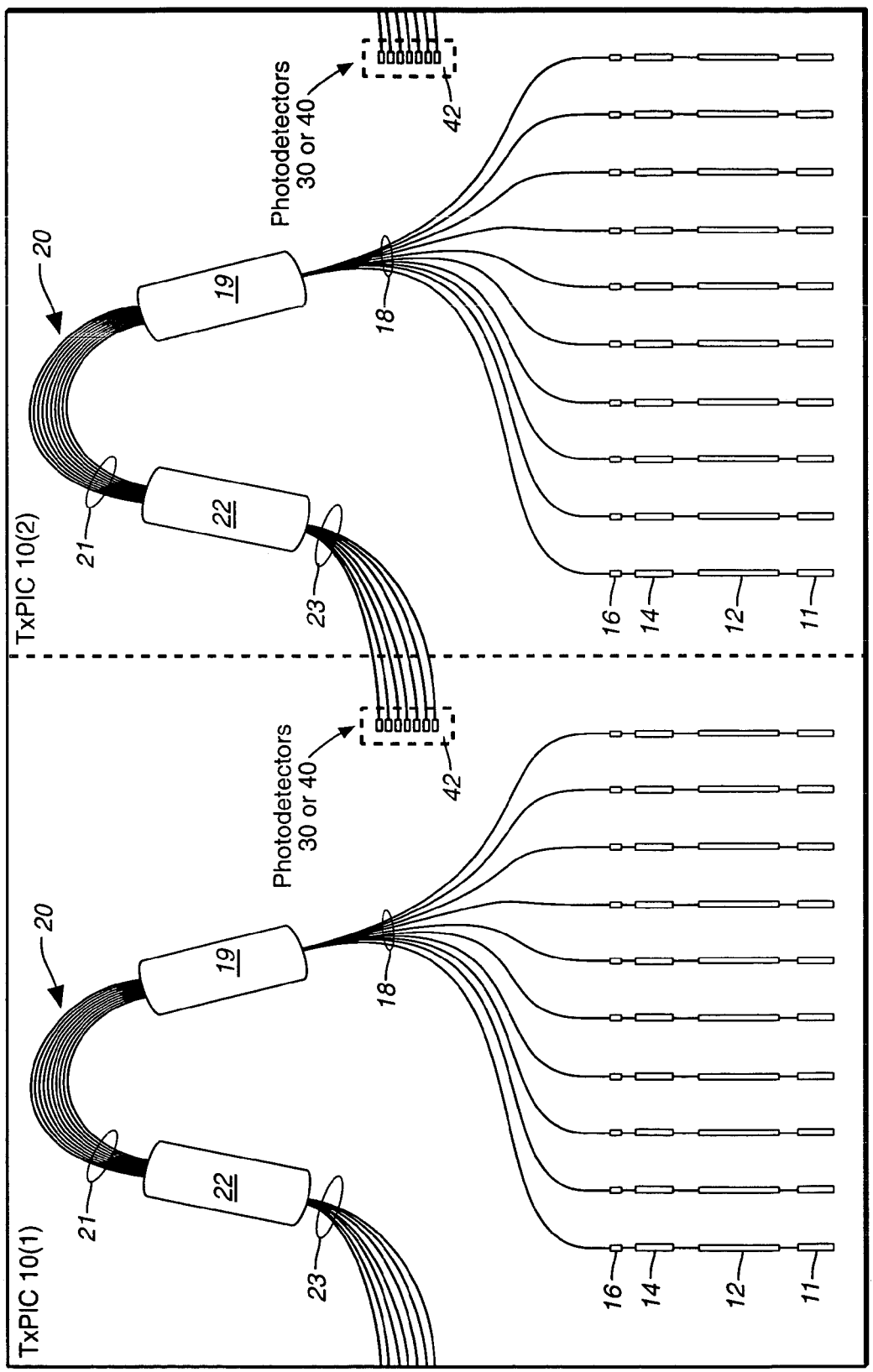
FIG._4

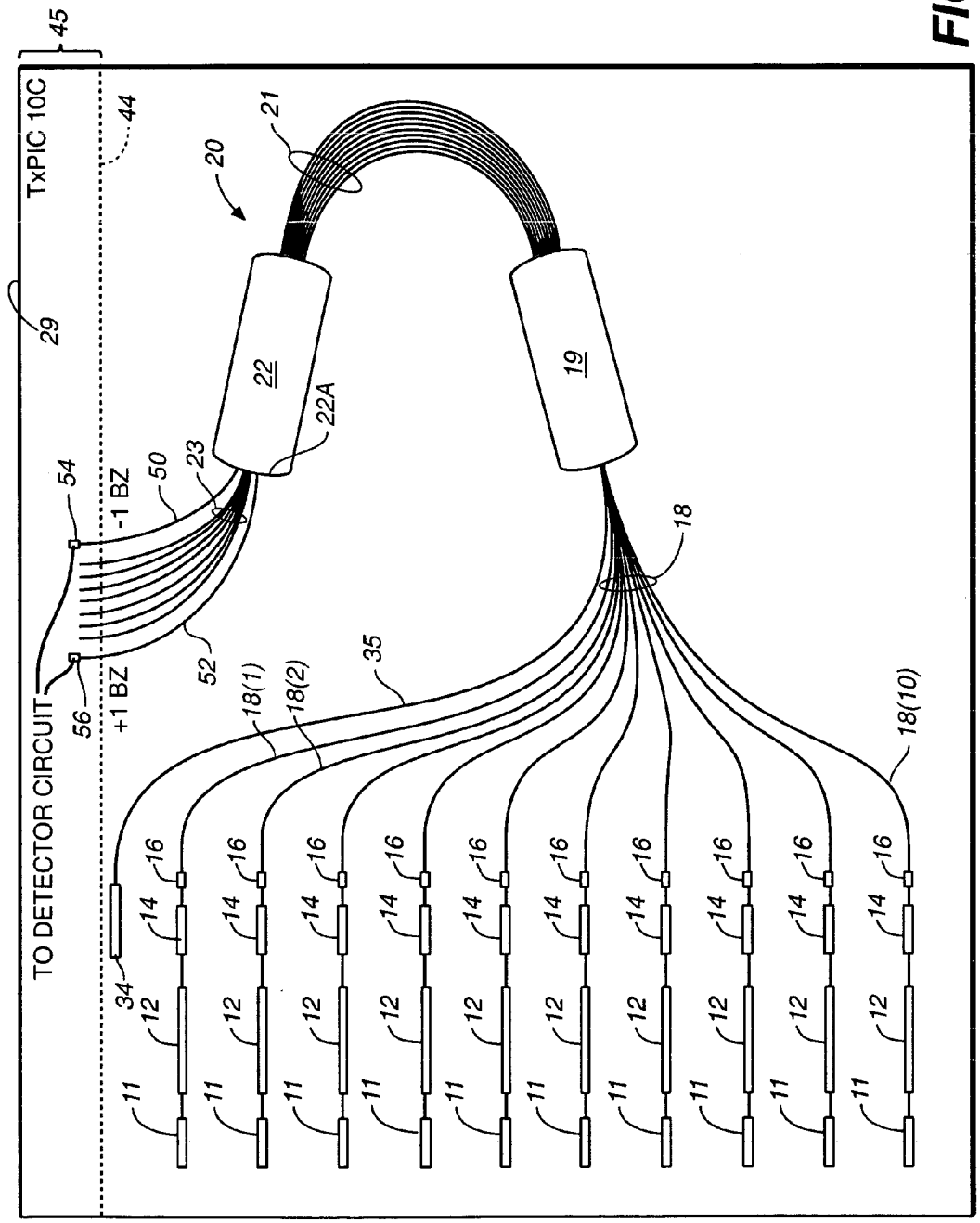
FIG._5

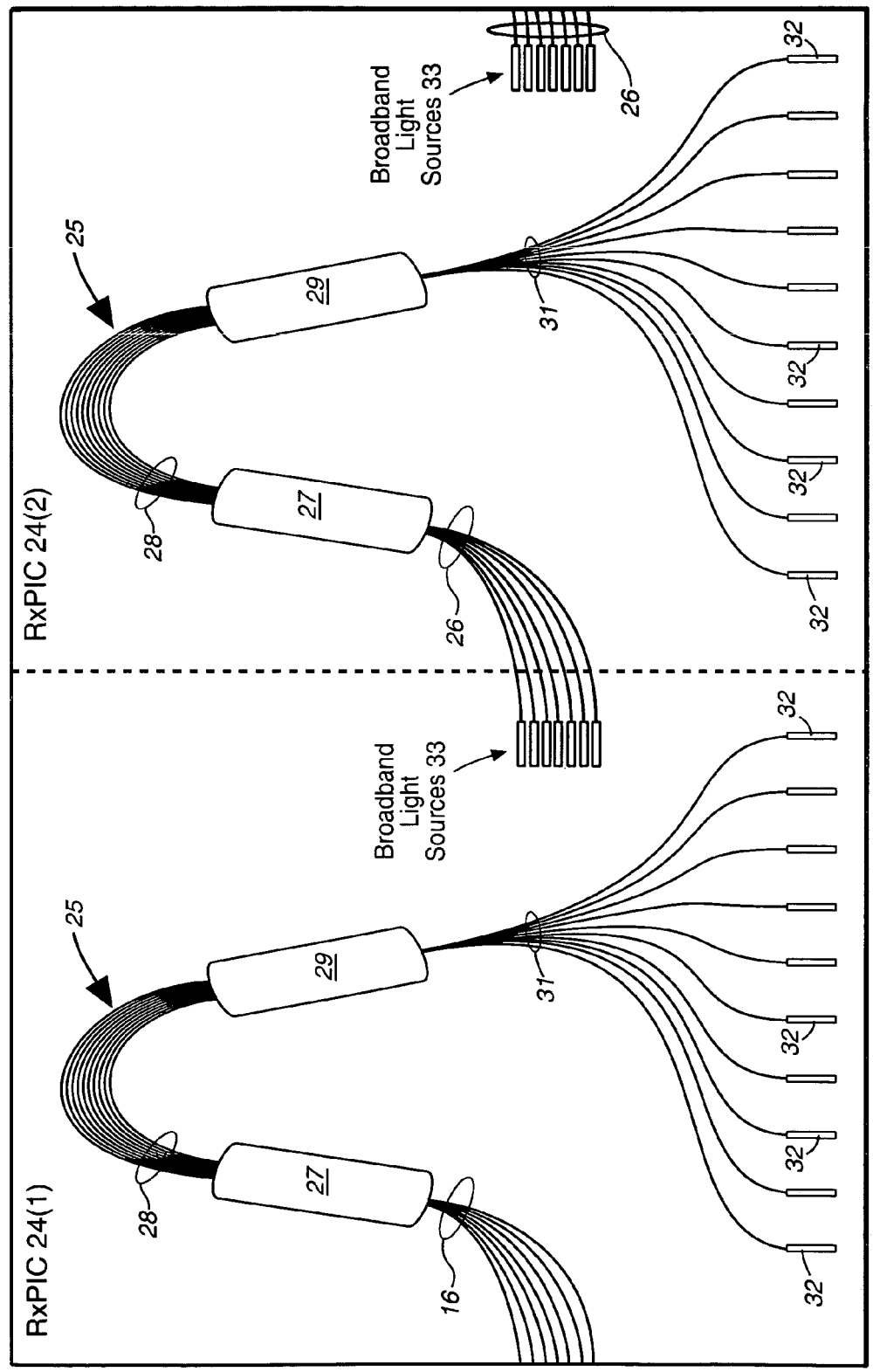
FIG._6

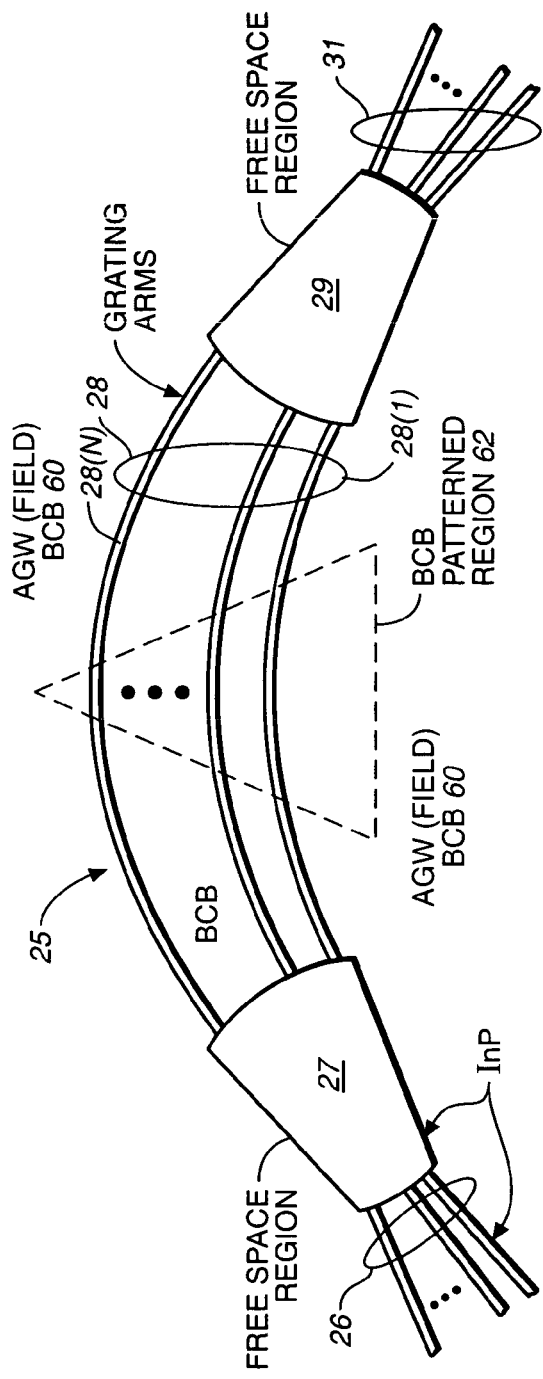
FIG._7
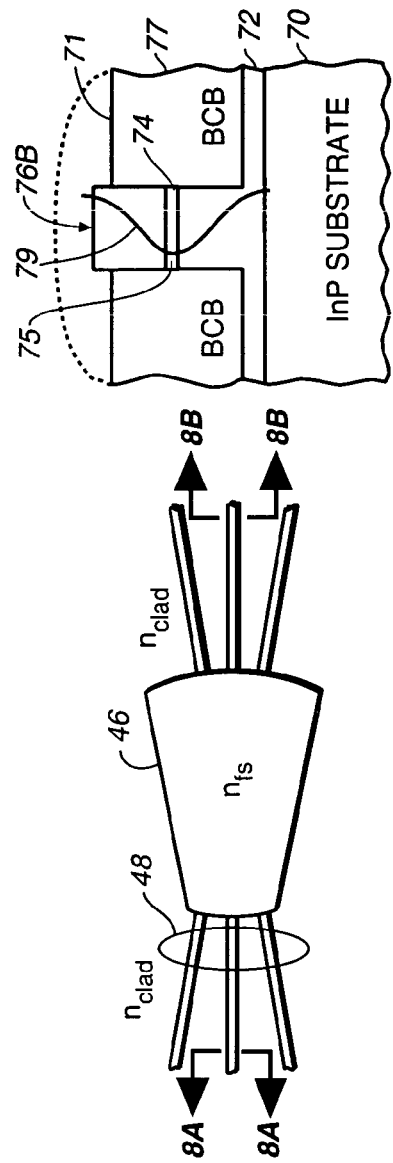
FIG._8B
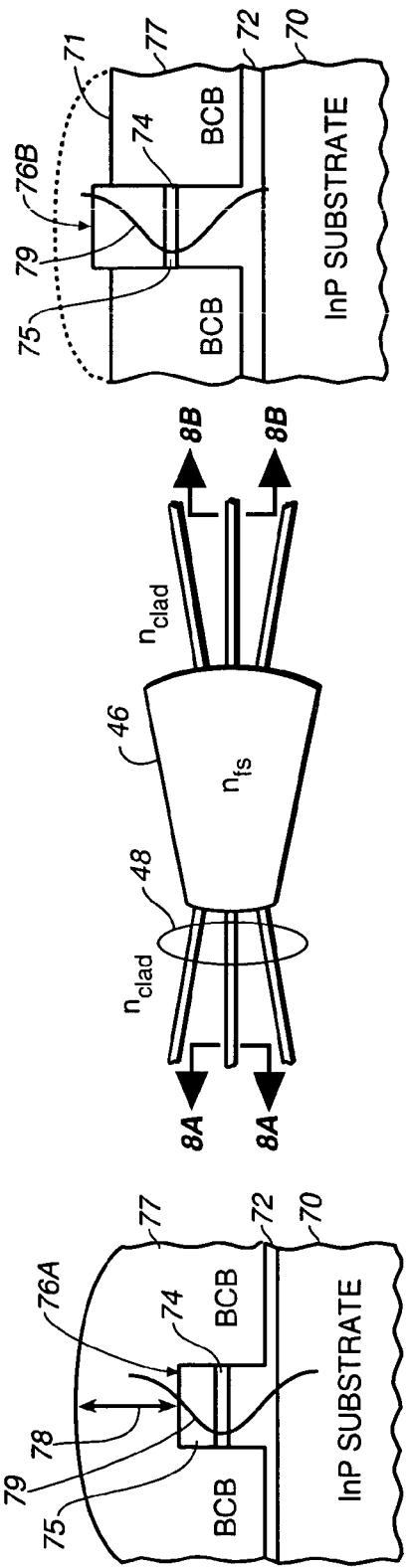
FIG._8
FIG._8A

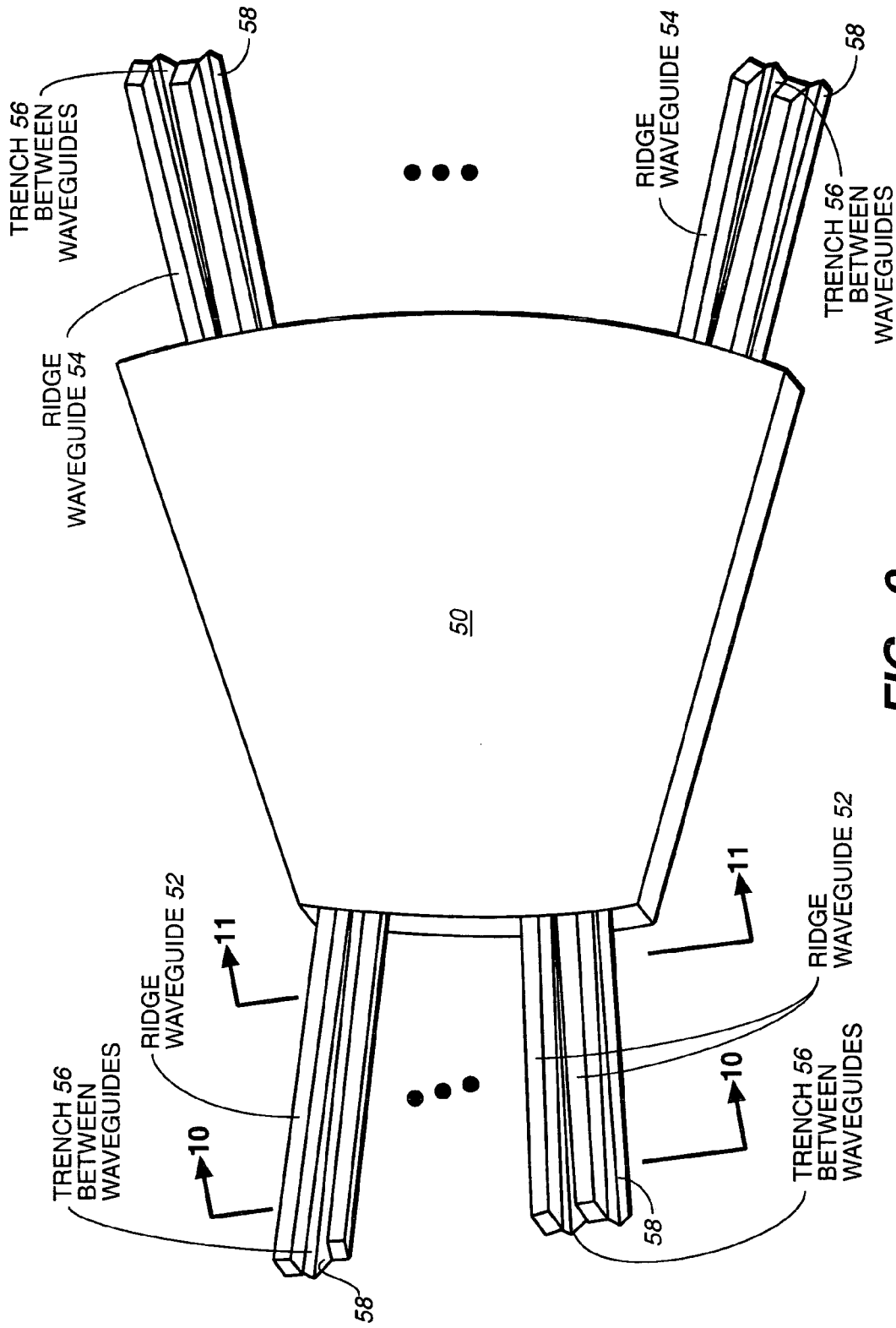
FIG._9

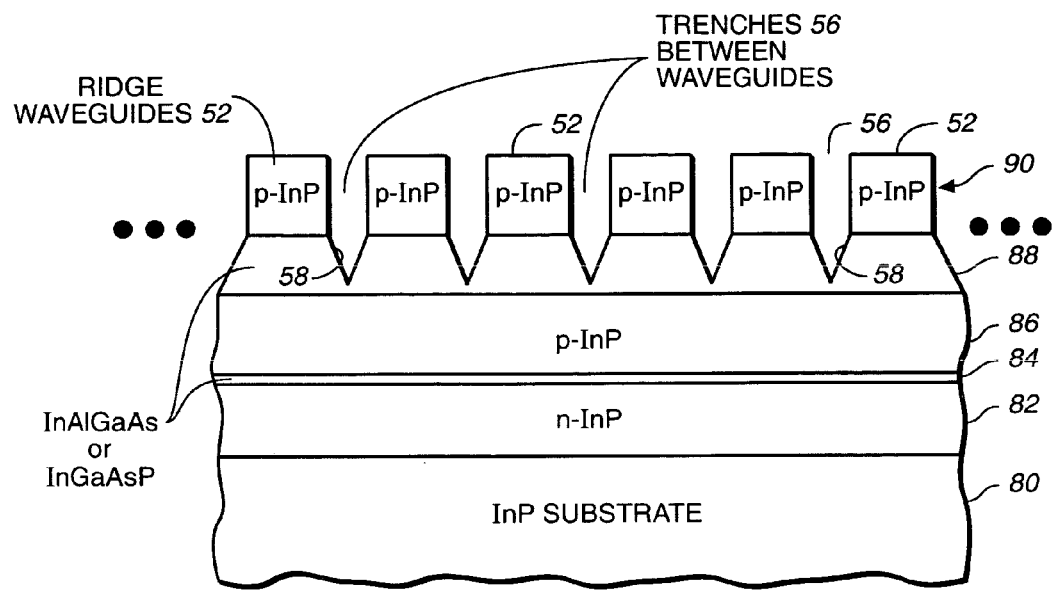
FIG._10
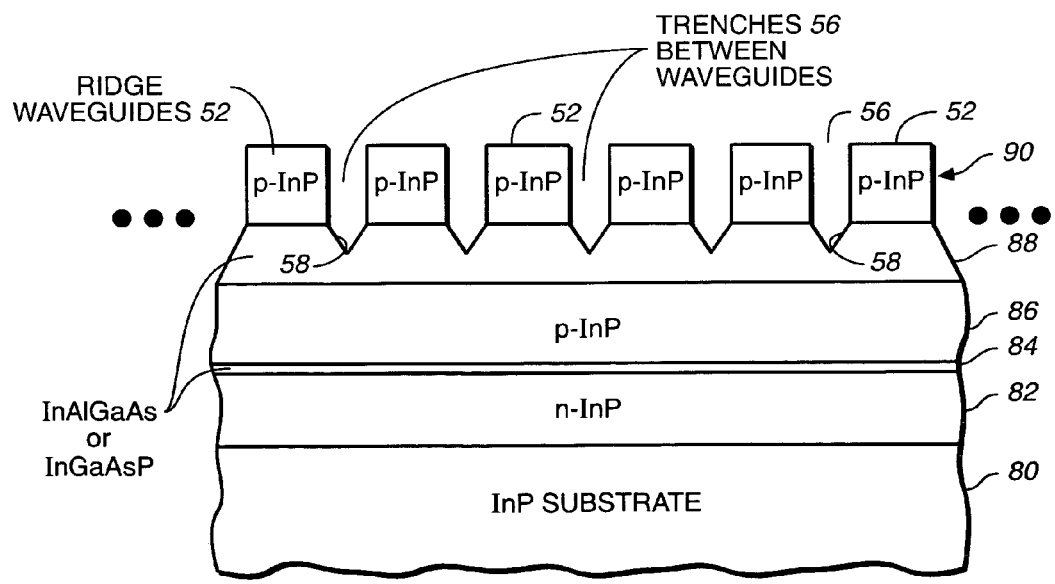
FIG._11

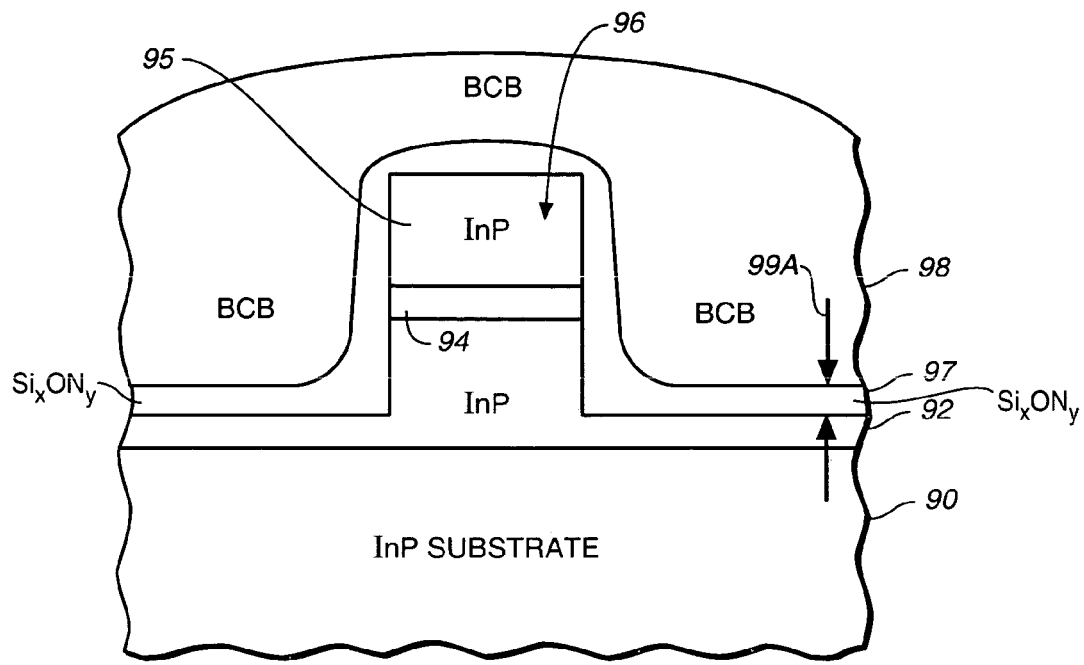
FIG._12
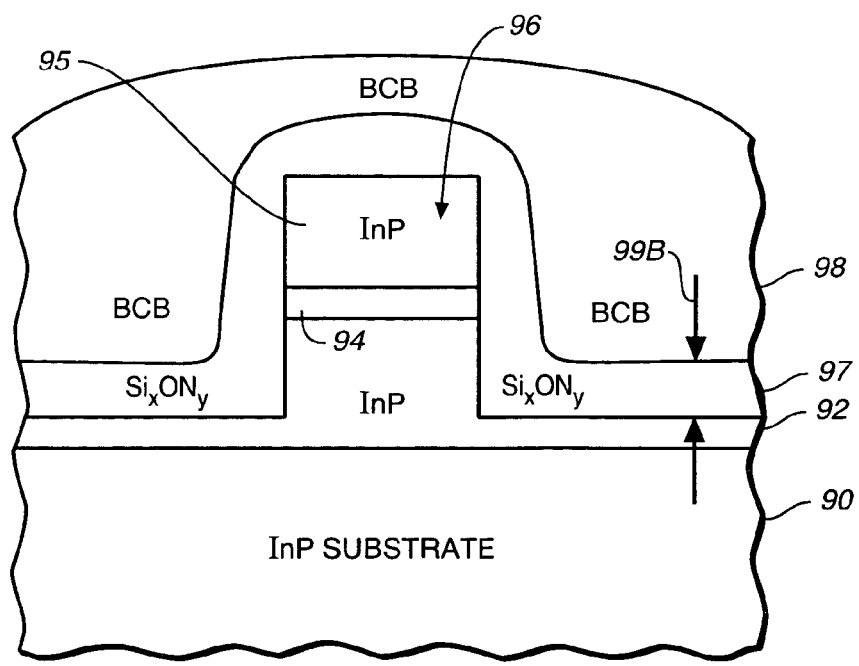
FIG._13

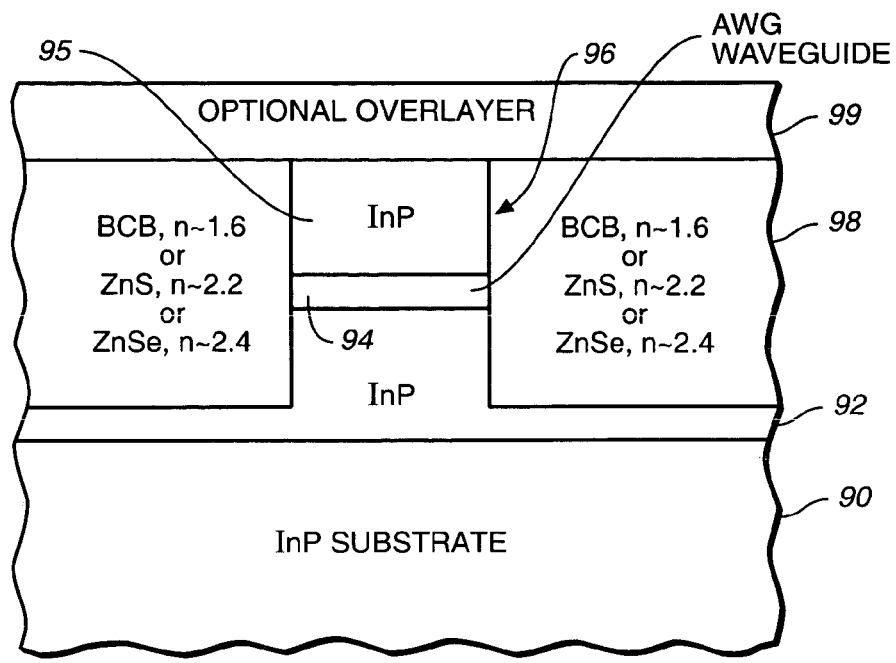
FIG._14
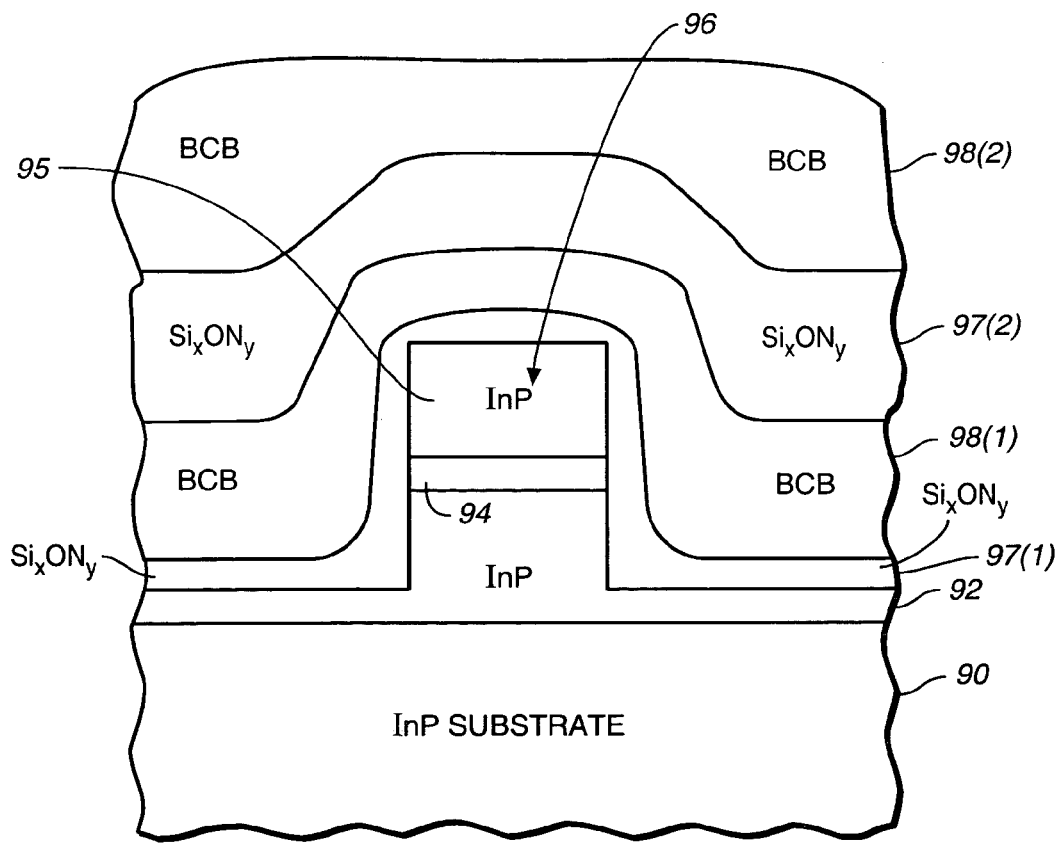
FIG._15

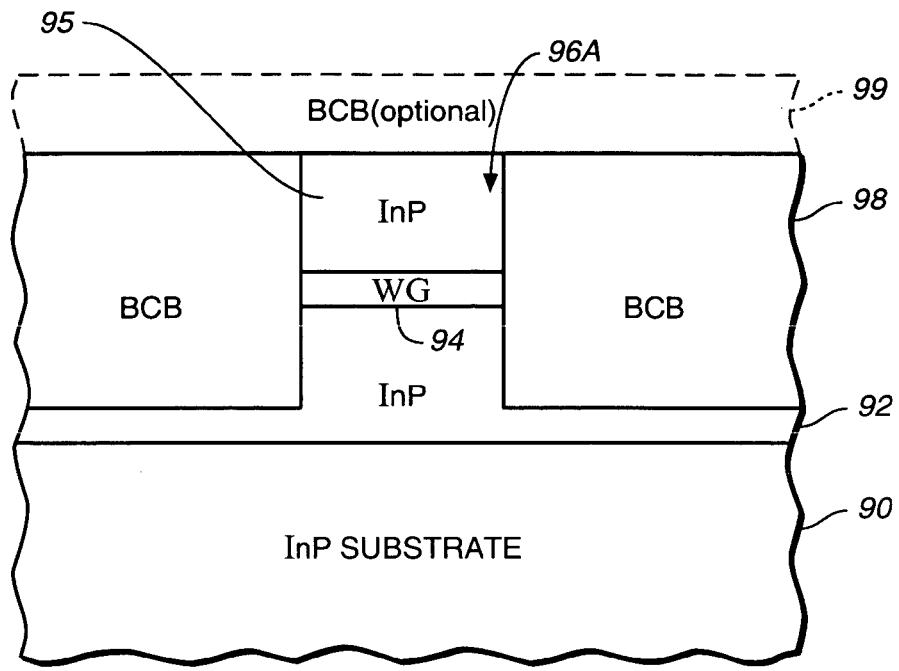
FIG._16
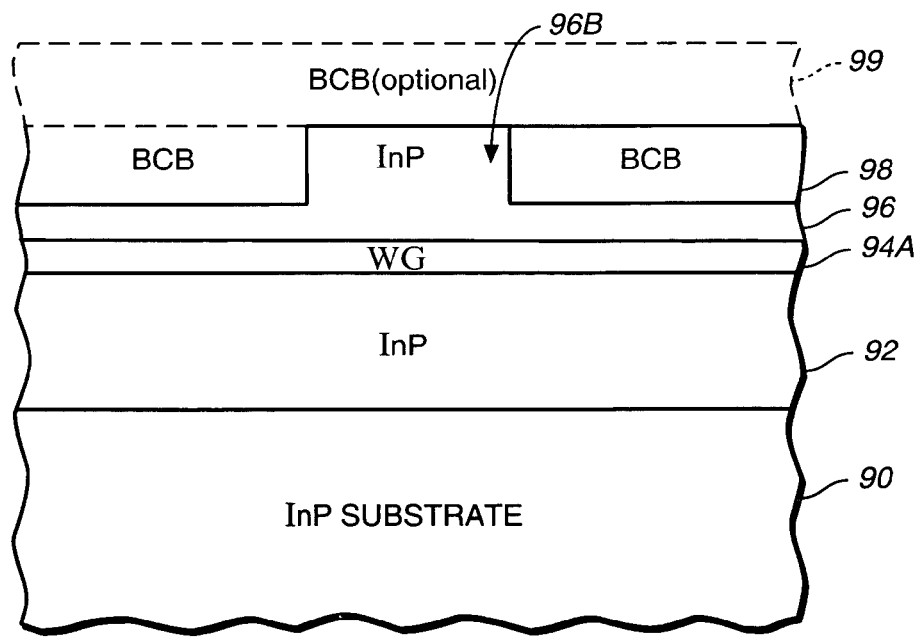
FIG._17

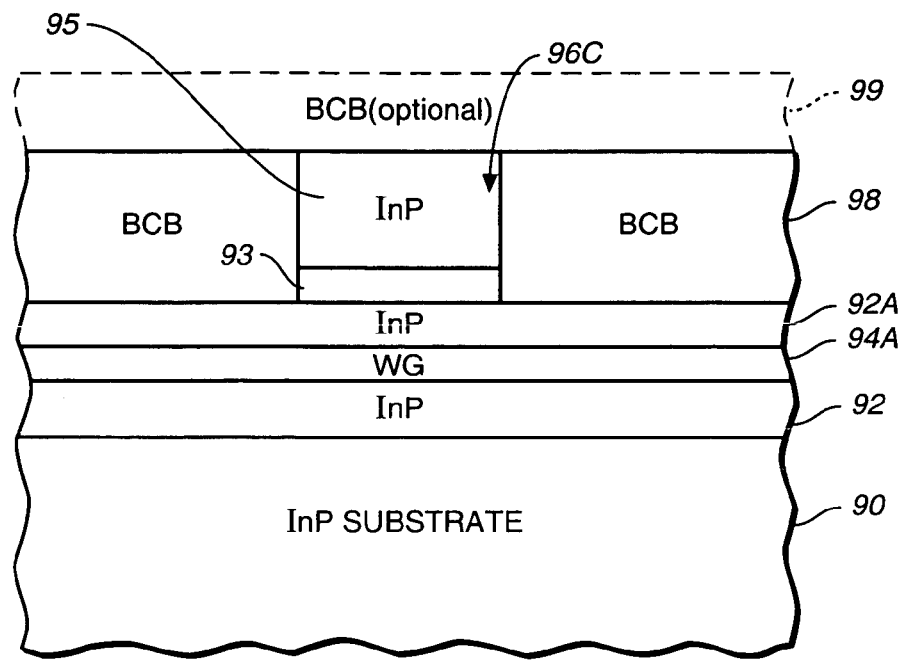
FIG._18
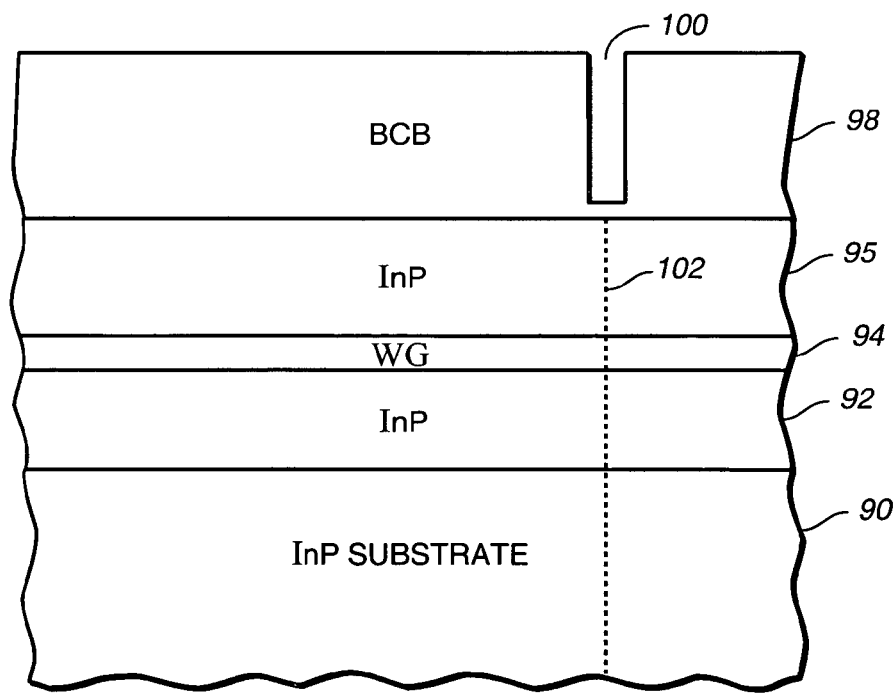
FIG._19

IN-WAFER TESTING OF INTEGRATED OPTICAL COMPONENTS IN PHOTONIC INTEGRATED CIRCUITS (PICS)

REFERENCE TO RELATED APPLICATION

This application is divisional application of patent application Ser. No. 10/385,574, filed Mar. 10, 2003, now U.S. Pat. No. 7,006,719, which claims priority to U.S. provisional application, Ser. No. 60/362,757, filed Mar. 8, 2002, which applications are incorporated herein by their reference.

BACKGROUND OF THE INVENTION

1. Field of the Invention

This invention relates generally to enhancement of optical components or devices and more particularly to improvements in and determination of optical characteristics in optical components and devices in photonic integrated circuits (PICs) or PIC chips, particularly when these chips are still die in semiconductor wafers.

2. Description of the Related Art

In-based integrated optical components in a monolithic photonic integrated circuit (PIC) chip have become a reality in recent times. Examples of such PIC chips are disclosed in U.S. patent application, Ser. No. 10/267,331, filed Oct. 8, 2002 and U.S. patent application, Ser. No. 10/267,304, filed Oct. 8, 2002, both of which are incorporated herein by their reference. One version of such a PIC is a monolithic optical transmitter photonic integrated circuit, or TxPIC, fabricated in an InP-based alloy system which include an array of modulated laser sources, such as DFB or DBR laser arrays, with their outputs coupled to a wavelength selective combiner such as an arrayed waveguide grating (AWG), or such CW operated laser sources are coupled through a corresponding array of electro-optic modulators to an AWG. The laser sources are designed to each operate at a different wavelength and together form a wavelength grid designed to match a standardized wavelength grid, such as the standard ITU wavelength grid.

The complexities in the manufacture of such TxPIC chips to specified wavelengths and desired wavelength grids is difficult to achieve in a uniform manner providing good reproducibility and high yield. For example, if the passband of the AWG is off or shifted from the desired wavelength grid and the laser source wavelength grid is as exactly as designed, the light from the laser sources may not pass through the AWG or, otherwise, may be severely attenuated from passing through the AWG. In general, if the AWG passband and the laser source wavelengths are not aligned, then an insignificant amount of light will emerge from the TxPIC chip rendering the chip of useless utility. To ease the manufacturing tolerances of the PIC AWG, as taught in Ser. No. 10/267,331, supra, a plurality of vernier outputs are formed at the output of the wavelength selective combiner to the facet exit of the chip. Each vernier output represents a slightly different selection of laser source wavelengths emerging from the AWG. Thus, chances are increased that one of the AWG vernier outputs will optimally align to the laser source wavelength grid relative to the passband of the AWG so that the laser source wavelengths will be substantially matched to at least one of the vernier outputs. As indicated, disclosure of these combiner vernier outputs can be found in Ser. No. 10/267,331, supra.

To test such a TxPIC chip, one approach is to measure the light out of the wavelength selective combiner for each laser source as a function of both applied current to the laser sources and their ambient temperature. If the TxPIC has any chance of utility, there is a temperature and range of currents where the laser wavelength sources will be substantially aligned with at least one of the combiner vernier outputs from the chip. For a discrete TxPIC chip, such testing can be accomplished by employing a large area detector or an integrating sphere. What would be more desirable is if such testing could be accomplished while the PIC chips remain in-wafer, i.e., prior to singulation of PIC die from an as-grown InP wafer, rather than later testing as a discrete PIC die. An advantage is obtained relative to advance knowledge of the PIC component operability and selection of a group of probable vernier outputs where the optimum combiner vernier output may lie or selection of the optimum vernier output exhibiting the highest matching quality of the laser wavelength grid to the passband and wavelength grid of the combiner. Compare this testing of individual die after their singulation which requires additional resources and time to mount the individual chips for such testing followed by individual testing of each chip for operability and optimum vernier output only to discover that the prepared chips are not operative or adequate for use. It would be desirable to know before wafer singulation which PIC die can be discarded because of their noted failure during in-wafer testing. Also, it would be helpful to know before wafer singulation which vernier output or, at least, subgroup of vernier outputs are favored, for the best laser source wavelength grid/combiner passband match prior to wafer singulation.

InP-based wavelength selective combiners, such as, Echelle gratings, arrayed waveguide gratings (AWGs) or cascaded Mach-Zehnder interferometers are of interest for a variety of applications. One of the most interesting of these applications is their deployment in photonic integrated circuits (PICs) as multiplexing and/or demultiplexing components or devices. The successful realization of practical devices utilizing, for example, InP-based AWGs, requires several features which also represent problems to be solved:

1. The ability to environmentally, electrically and optically passivate etched waveguides.
2. The ability to form a polarization insensitive device.
3. The ability to reduce the refractive index step between the waveguide and the free-space region or slab of the AWG for reduced insertion loss.
4. Compatibility with planar PIC processing.
5. The ability to isolate AWGs from active or activating components placed on an AWG or on the PIC in close proximity to an AWG, e.g., on-chip heaters or tuning electrodes.
6. Reduce the effects of side wall surface roughness in etching the AWG waveguide ridge structure.

The conventional technique for accomplishing features 1–6 in the art is to utilize buried structures wherein InP regrowth is utilized to form an overlayer or burying layer. However, buried waveguide structures are difficult to achieve on a reproducible and repeated basis, require sophisticated wafer fabrication and epitaxial growth, result in lower yield, and are generally more costly to manufacture. Ridge waveguide structures are preferred for reasons of simplicity, yield and cost. However, the problems associated with items 1–6 above must be addressed in a rigid waveguide structure in order to realize a practical optical component or device.

Another aspect of PICs utilizing an optical combiner as an integrated component is the design of the component to have low insertion loss (IL). With the increase of the number of components integrated on a single chip, the requirements for wafer uniformity as well as uniformity in layer growth in composition and thickness becomes a more critical issue. One way of lowering insertion losses in the AWG, for example, which is documented in the art, is to reduce the refractive index change in the transition coupling region between the multiple waveguides of the AWG and the free space region of the AWG. An example of this art is shown in the article of J. H. den Besten et al. entitled, "Low-Loss, Compact, and Polarization Independent PHASAR Demultiplexer Fabricated by Using a Double-Etch Process", *IEEE Photonics Technology Letters*, Vol. 14(1), pp. 62–64, January, 2002. As shown in this article, shallow and deep etched waveguides are combined such that a widening of the propagating mode is provided from the deep ridge of the waveguide to the shallow ridge of the waveguide and thence to the free space region of the AWG. This provides for a gradual or monotonic and adiabatic expansion of the mode through such a transition region decreasing insertion losses and coupling losses between the waveguide and the free space region as well as improving optical coupling between adjacent waveguides in the transition region and coupled to the free space region. What is desired is to improve the reduction in insertion loss without requiring different, stepped etched depths as taught in de Besten et al. in the waveguides in these transition regions.

OBJECTS OF THE INVENTION

Therefore, it is an object of the present invention to overcome the aforementioned problems.

It is a further object of this invention to provide in-wafer testing and coarse and fine selection of wavelength selective vernier outputs from PIC chips including such components.

It is another object of this invention to reduce insertion loss in optical components in PICs.

It is a still further object of this invention to passivate and planarize the top surface of PIC chips.

SUMMARY OF THE INVENTION

According to this invention, an apparatus and method is provided relative to a photonic integrated circuit (PIC) chip which includes a plurality of laser sources among other active and passive components on the PIC chip providing output having different wavelengths of operation. The laser source outputs are optically combined with a wavelength selective combiner that has a plurality of on-chip vernier outputs along an output face of the combiner. Either a plurality of vernier photodetectors or an integrating photodetector is formed at the ends of the vernier outputs. The integrating photodetector provides a precursor indicative of the potentially optimum vernier output(s) based upon on a degree of match between a wavelength grid formed by the laser sources and a wavelength passband of the optical combiner. The individual vernier photodetectors provide a means by which the optimum vernier output can be determined. The wavelength selective type of optical combiner is preferred but the invention can be practice with optical power couplers. The individual vernier photodetector can-be formed on the same PIC chip or on an adjacent PIC chip and utilized as such while the chips are still in their in-wafer form. Thus, the vernier photodiodes can be or are later cleaved from the chip after the completion of in-wafer testing and wafer singulation.

In another aspect of this invention, the integrating photodetector can be utilized as a coarse determination of a vernier subgroup of the total group of vernier outputs that contains the optimum vernier output and then, thereafter, a fine determination of the individual vernier output in the identified vernier subgroup that provides an optimum vernier output. The fine determination can be accomplished by individual photodetector monitoring of the determined vernier output subgroup either through the individual in-chip vernier photodetectors after removal of any integrating contact or through contact testing of the individual in-chip vernier photodetectors.

The in-chip vernier output photodetectors may also be employed to check other on-chip optical components such as individual determination of the desired bias points for in-chip laser source heaters, laser sources, electro-optic modulators or other on-chip photodetectors.

Further, according to this invention, an apparatus and method is provided relative to a photonic integrated circuit (PIC) chip which includes a plurality of photodetectors provided at ends of higher order Brillouin zone outputs of an optical combiner positioned on both sides of a zero order Brillouin zone of the optical combiner that includes a plurality of vernier outputs from the n-chip wavelength selective combiner. The higher order Brillouin zone photodetectors provide detection outputs indicative of which zero order Brillouin zone vernier output has an optimum output based upon a degree of matching between the laser source wavelength grid and the passband and wavelength grid of the optical combiner. The higher order Brillouin zone photodetectors can be formed on the PIC chip or an in-wafer adjacent PIC and later cleaved from the chip upon the completion of testing.

Another feature, according to this invention, is a method of adjusting the center channel wavelength of channel signal wavelengths from a plurality of laser sources in a photonic integrated circuit (PIC) relative to the center of a wavelength passband of an optical combiner, which is optically coupled to receive the outputs of the laser sources by selectively removing a portion of a passivation layer overlying the wavelength selective combiner to change the effective refractive index in regions overlying the optical combiner.

A further feature according to this invention is a method of selectively patterning the passivation dielectric layer over the wavelength selective combiner to achieve polarization insensitive performance defined by the TE-TM wavelength shift being approximately less than or equal to 20% of a magnitude of the channel spacing.

Another feature according to this invention is photonic integrated circuit (PIC) comprising a plurality of integrated optically coupled components formed in a surface of the PIC, a passivating layer is formed over the PIC surface, the passivating layer characterized by comprising a material selected from the group consisting of BCB, ZnS and ZnSe. Such a passivation dielectric layer from this group is also provided as an overlayer for the in-chip wavelength selective combiner, such as an InP-based AWG, to reduce insertion loss of the device by minimizing a refractive index step existing between free-space regions of the device and its input and output waveguides, such as, for example, ridge waveguides.

It is a further feature according to this invention to utilize an additional laser source or more integrated on the TxPIC chip employed as a testing source for the on-chip wavelength selective combiner. Such a source may be any kind of laser source, beside a DFB or DBR laser, such as, but not limited to, a Fabry-Perot laser, a superluminescent source, and possibly an LED source. Such an additional laser source provides for higher power output for in-wafer testing purposes. The light output from the laser must be within the passband of the wavelength selective combiner and has the advantage of providing a higher light output for conducting PIC in-wafer testing. An in-chip laser source for signal channel operation could also be deployed for this function. However, it is necessary in such a case to forward bias other in-chip electro-optic components in the optical path ahead of such laser sources, such as an electro-optic modulator or a photodetector, which would otherwise be absorptive of the laser source light. With forwarding biasing of such components, the light output from an active laser source should be sufficient to be detected at the vernier photodetectors.

A still further feature according to this invention is the deployment of "cleave streets" in a thick wafer passivation overlayer to provide for correctly aligned and sharp cleaves in the singulation of a wafer into separate PIC chips. Such cleave streets are also applicable to silicon-based integrated circuits utilizing such a passivating layer.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts:

FIG. 1 is a schematic plan view of a photonic integrated circuit (PIC) comprising an optical transmitter photonic integrated circuit (TxPIC) that includes an additional laser source for in-wafer testing.

FIG. 2 is a schematic plan view of an optical transmitter photonic integrated circuit (TxPIC) similar to FIG. 1 but further includes a plurality of on-chip vernier photodetectors for a plurality of vernier outputs from the on-chip wavelength selective combiner for determining optical characteristics of the PIC.

FIG. 3 is a schematic plan view of an optical transmitter photonic integrated circuit (TxPIC) similar to FIG. 1 but further includes an on-chip integrated photodetector array for determining optical characteristics of the PIC.

FIG. 4 is a schematic plan view of two in-wafer transmitter photonic integrated circuit (TxPIC) chips with a first PIC chip having a vernier photodetector array for the testing of vernier outputs on an adjacent, second PIC chip.

FIG. 5 is a schematic plan view of an optical transmitter photonic integrated circuit (TxPIC) similar to FIG. 1 except that it includes complementary Brillouin zone outputs for aiding in predicting the best TxPIC output vernier.

FIG. 6 is a schematic pan view of two in-wafer receiver photonic integrated circuit (RxPIC) chips with a first PIC chip having broadband light sources coupled to the vernier inputs of an adjacent, second PIC chip for use in determining optical characteristics of the second PIC chip.

FIG. 7 is a plan view of an arrayed waveguide grating having an upper cladding of a low stress material having a higher index than air.

FIG. 8 is a plan view of a free space region having a refractive index of $n_{free-space}$ buried with a cladding layer having a refractive index, $n_{clad}$.

FIG. 8A is a cross-sectional view taken along the line 8A—8A in FIG. 8.

FIG. 8B is a cross-sectional view taken along the line 8B—8B in FIG. 8.

FIG. 9 is a first embodiment comprising a partial perspective view of input waveguides to and output waveguides from a free space region, which waveguides may also be the input or output arms and grating arms of an AWG to provide for reduced insertion loss.

FIG. 10 is a cross-sectional view taken along the line 10—10 of FIG. 9.

FIG. 11 is a cross-sectional view taken along the line 11—11 of FIG. 9.

FIG. 12 is a cross-sectional view of a second embodiment of one input or output waveguide to or from a free space region, such as an optical coupled or an AWG, at a position further away from the free space region than the position illustrated in FIG. 13.

FIG. 13 is a cross-sectional view of a second embodiment of one input or output waveguide to or from a free space region, such as an optical coupled or an AWG, at a position closer to the free space region than the position illustrated in FIG. 12.

FIG. 14 is a cross-section of a first embodiment comprising one of the ridge waveguides of a wavelength selective component, such as an AWG, utilizing a passivation or planarization layer such as BCB, ZnS or ZnSe.

FIG. 15 is a cross-section of a second embodiment comprising a ridge waveguide utilizing a passivation or planarization alternating layers of $Si_xON_y$ and BCB.

FIG. 16 is a cross-section of a third embodiment comprising a deep ridge waveguide utilizing a passivation or planarization layer such as BCB.

FIG. 17 is a cross-section of a third embodiment comprising a shallow ridge waveguide utilizing a passivation or planarization layer such as BCB.

FIG. 18 is a cross-section of a fourth embodiment comprising a rib-loaded slab waveguide utilizing a passivation or planarization layer such as BCB.

FIG. 19 is a cross-section of an embodiment employing "cleave streets" in the surface of passivating overlayers to provide for a clean cleave point.

DETAILED DESCRIPTION OF THE INVENTION

Reference is now made to FIG. 1 which illustrates a TxPIC chip 10 of a type presently in fabrication and operation to which the features of this invention including AWG testing and insertion loss reduction is applied relative later described figures. It should be noted that the attributes of this invention are equally applicable to any other PICs, such as optical receiver photonic integrated circuit (RxPIC) chips which are disclosed in U.S. patent application, Ser. No. 10/267,304, supra and any other such PICs having integrated active and passive optical or electro-optic components.

TxPIC chip 10 is an In-based chip, the structural details of which are disclosed in U.S. patent application, Ser. No. 10/267,331, supra. As shown in FIG. 1, monolithic PIC chip 10 comprises groups of integrated and optically coupled active and passive components including an integrated array of laser sources 12, such as DFB semiconductor lasers or DBR semiconductor lasers. Each laser source 12 operates at a different wavelength, $\lambda_1$–$\lambda_N$, from one another where the group of wavelengths provides a wavelength grid commensurate with a standardized wavelength grid, such as the ITU standard grid. At the rear extent of laser sources 12 are rear photodetectors 11, which are optional, which may be coupled to sources via waveguide 18A or may abut the rear extent or facet of a corresponding laser source. Photodetectors 11 may be, for example, PIN photodiodes or avalanche photodiodes (APDs). The laser sources may be directly modulated or may be provided with an associated electro-optic modulator as shown in the example here. The CW outputs of laser sources 12 are shown coupled to electro-optic modulators 14. Modulators 14 may be electro-absorption modulators (EAMs) or Mach-Zehnder modulators (MZMs) as detailed in patent application, Ser. No. 10/267,331, supra. Modulators 14 may be optically coupled to a corresponding laser source 12 via waveguide 18B or may abut the forward extent or front facet of a corresponding laser source. Modulators 14 each apply an electrical modulated signal to the CW light from laser sources 12 producing an optical modulated signal for transmission on an optical link or span. The modulated outputs from modulators 14 are coupled via waveguide 18C to a front photodetectors 16. Photodetectors 16 are optional and may alternatively be optically coupled to modulators 14 in abutting relationship. Photodetectors 16 may also be fabricated off-axis of the laser source output by means of an on-chip optical tap to provide a small portion of the modulated output to the photodetector. Front photodetectors 16 may be PIN photodiodes or avalanche photodiodes (APDs). Photodetectors 11 and 16 may be employed to determine the output power from the respective laser sources 12. Alternatively, photodetectors 16 may also function as variable optical attenuators (VOAs) in order to equalize the output power across all of the laser sources 12. On the other hand, photodetector 16 may be employed as on-chip semiconductor optical amplifiers (SOAs). Also, a different frequency tone may be applied to each photodetector 16 to provide for laser source tagging as described in U.S. patent application, Ser. No. 10/267,330, filed Oct. 8, 2002, which application is incorporated herein by its reference.

As indicated above and as explained in more detail in patent application, Ser. No. 10/267,331, modulators 14 may be fabricated as electro-absorption modulators (EAMs) or Mach-Zehnder modulators (MZMs). The modulated optical signal outputs of modulators 14, via front photodetectors 16, are respectively coupled to an on-chip wavelength selective combiner, shown here as an arrayed waveguide grating or AWG 20 via optical input waveguides 18. It is within the scope of this invention to include other wavelength selective combiners or decombiners, as the case may be, such as Echelle gratings or cascaded Mach-Zehnder interferometers (MZIs). Also, it is within the scope of this invention to practice the invention in connection with non-wavelength selective type of optical combiners, such as power couplers, star couplers or MMI couplers. Each of the laser source/modulator combinations or, for example, semiconductor modulator/lasers (SMLs) is, therefore, representative of an optical signal channel on TxPIC chip 10. There is a plurality of N channels on each TxPIC chip 10 and, in the case here, ten such channels are shown as numbered one through ten in FIG. 1. There may be less than 10 channels or more than 10 channels formed on chip 10. In the case here, the output of each signal channel is coupled to a respective waveguide 18(1) to 18(10) to the zero order Brilloum zone input of AWG 20.

Each signal channel is typically assigned a minimum channel spacing or bandwidth to avoid crosstalk with other optical channels. Currently, for example, 50 GHz, 100 GHz or 200 GHz are common channel spacings. The physical channel spacing or center-to-center spacing 28 of the signal channels may be 100 µm, 200 µm, or 250 µm or more to minimize electrical or thermal cross-talk at data rates, for example, of 10 Gbit per sec or greater and facilitate routing of interconnections between bondpads of multiple PIC elements. Although not shown for the sake of simplicity, bonding pads may be provided on the surface of PIC chip 10 to accommodate wire bonding to the on-chip electro-optic components.

Metal interconnects between bondpads (not shown) and electro-optic components are at least partly formed on a surface of an isolation passivation medium formed over PIC chip 10. The medium is employed to passivate and permit uniform planarization of the surface of chip 10. Such a medium may be, for example, polyimide, BCB, ZnS or ZnSe. In this connection, all the bonding pads are formed by forming vias through the planarized medium after which metal vias are formed. Electrical connection between ground bondpads and a ground plane formed in PIC chip 10 from the planarized surface of the passivation medium. Bondpads may be supported from the surface of the top semiconductor layer of chip 10, such as a semiconductor contact layer, for example $p^+$-InGaAs, by means of metal vias formed through the planarized surface of the passivation medium.

As indicated above, the respective modulated outputs from electro-optic modulators 16 are coupled into optical waveguides 18(1) to 18(10) to the input of AWG 20. AWG 20 comprises an input free space region 19 coupled to a plurality of diffraction grating waveguides 21 which are coupled to an output free space region 22. The multiplexed optical signal output from AWG 20 is provided to a plurality of output waveguides 23 which comprise output verniers along the zero order Brillouin zone at output face 22A of free space region 22. Output waveguides 23 extend to output facet 29 of TxPIC chip 10 where a selected vernier output 23 may be optically coupled to an output fiber (not shown). The deployment of multiple vernier outputs 23 provides a means by which the best or optimum output from AWG 20 can be selected having the best match of the wavelength grid passband of AWG 20 with the established wavelength grid of the group of channel signal outputs from the array of laser sources 12. Seven vernier outputs 23 are shown in FIG. 1. It should be realized that any number of such vernier outputs may be utilized beginning with the provision of two of such vernier outputs. Also, the number of such vernier outputs may be an odd or even number.

In operation, AWG 20 receives N optical signals, $\lambda_1$–$\lambda_N$, from coupled input waveguides 18 which propagate through input free space region 19 where the wavelengths are distributed into the diffraction grating waveguides 21. The diffraction grating waveguides 21 are plurality of grating arms of different lengths, $\Delta L$, relative to adjacent waveguides 21, so that a predetermined phase difference is established in waveguides 21 according to the wavelengths $\lambda_1$–$\lambda_N$. Due to the predetermined phase difference among the wavelengths in grating arms 21, the focusing position of each of the signals in grating arms 21 in output free space region 22 are substantially the same so that the respective signal wavelengths, $\lambda_1$–$\lambda_N$, are focused predominately at the center portion or the zero order Brillouin zone of output face 22A. Verniers 23 receive various passband representations of the multiplexed signal output from AWG 20. Higher order Brillouin zones along output face 22A receive repeated passband representations of the multiplexed signal output at lower intensities. The focus of the grating arm outputs to the zero order Brillouin zone may not be uniform along face 22A comprising this order due to inaccuracies inherent in fabrication techniques employed in the manufacture of chip 10. However, with multiple output verniers, an output vernier can be selected having the best or optimum signal output in terms of power and strength.

Also shown in FIG. 1 is an additional laser source 34 coupled directly to the zero order or higher Brillouin zone input of AWG 20 via optical input waveguide 35. Laser source 34 may be any type of semiconductor laser including a Fabry-Perot laser source or a superluminescent source or possibly a LED source, such as one with some coherency within the bandwidth of laser sources 12. Laser source 34 is employed to provide a high intensity on-chip light source to provide a comparatively on-chip higher intensity light output at output verniers 23 which is deployed to achieve optimum optical coupling alignment between a finally selected vernier output and an optical fiber terminus. Alternatively, there can be more than one such laser source 34 for purposes of testing PIC 10, but more particularly for redundancy should on the these sources fail to operate.

Also, PIC chip 10 may include waveguide 27 coupled to on-chip photodetector 28 which may be employed to monitor back reflection intensity from front facet 29 during the process of forming an antireflection (AR) coating on the surface of facet 29. The final thickness of the AR coating is achieved at the point of received lowest level of back reflected light from facet 29 is received by the photodetector via AWG 20. Other details relative to this AR coated facet monitoring can be gleaned from the description of FIG. 9 in patent application, Ser. No. 10/267,331, supra.

Reference is now made to FIG. 2 which illustrates substantially the same TxPIC chip 10 in FIG. 1 except that TxPIC chip 10A includes an array of photodetectors 30 each of which is respectively coupled to a vernier output 23. Photodetectors 30 may be, for example, PIN photodiodes or avalanche photodiodes (APDs). These detectors 30 can be each selectively monitored while chip 10A still remains part of a wafer to determine which output vernier provides the optimum vernier output from AWG 20 after testing, for example, AWG 20 via laser source 34 and testing the respective sources 12 and their accompanying heaters (not shown) as well as electro-optic modulators 14 for their photoluminescence (material bandgap) and/or bias point. After chip 10A is singulated from its wafer, the portion 45 of the array of photodetectors 30 may be removed from chip 10A by means of cleaving as indicated by dotted line 44 in FIG. 2. Having previously identified the optimum vernier output 23, chip 10A may be submounted for further testing and provided in a module package that includes alignment of an optical fiber input terminus to the optimum vernier output.

As used herein, "optimum vernier output" means the vernier output exhibiting the substantially highest power output and the best match between the laser source wavelength grid and the wavelength grid and/or passband of the optical combiner employed.

Reference is now made to FIG. 3 which illustrates substantially the same TxPIC chip 10 of FIG. 1 except that TxPIC chip 10B of FIG. 3 includes a row of integrating photodetectors 40 optically coupled to receive the vernier outputs from AWG 20. Thus, photodetectors 40 are fabricated in TxPIC die of an In-based wafer along with the other optical components comprising TxPIC 10A and function as in-chip photodetectors 40, one each of the vernier outputs 23, to provide for in-wafer testing of vernier outputs 23. Photodetectors 40 function as an integrating detector by deployment of single electrode contact 42 electrically coupled to all of the photodetectors as shown in FIG. 2. As such, the formed integrating detector is employed to measure the total amount of light that is emerging from AWG 20 along the zero order Brillouin zone of output face 22A of AWG 20. What is important to discern from a testing perspective is that the laser source wavelengths are aligned to the passband of the AWG. While testing the output of each individual photodetector 40 would nice to ascertain the individual output from each of the vernier outputs 23, it may not be necessary to do so, although the approach of FIG. 2 may be considered more preferable, it is more complex in terms or time for testing of individual detectors. Instead in FIG. 3, the total, combined output of the array of photodetectors 40 is employed employing a single contact metallization for all of the photodetectors. This creates the equivalent of an on-chip integrating sphere wherein the total light emerging from AWG 20 through all of the vernier waveguides is measured by the array of photodetectors 40 which, as previously indicated, can be referred to as an integrating detector. The output 46 from the integrated detector is provided at connected bond wire 46 to an off-chip detection circuit. Photodetectors 40 may be positioned on TxPIC chip 10B such that they can be readily cleaved from the chip along cleave line 44 after completion of their utility of in-wafer testing and chip singulation from the wafer. The vernier outputs 23 not to utilized as a PIC chip output can be alternatively deployed as optical taps for later monitoring of the PIC chip output, such as, for example, during initial transmitter module testing or field testing.

The testing approach of FIG. 3 is most useful in the situation where the on-chip power is not sufficient for individual photodetector testing during the testing phase of an in-wafer PIC. The total power across all vernier outputs detected by the integrating detector 40, which is electrically measured electrically via the total optical output received from photodetectors, functions as a precursor indication of the level of successful matching of the laser source wavelength grid to the designed passband of AWG 20 of in-wafer TxPIC chip 10A under test. The benefit achieved is that if the total power is not sufficient high or above a predetermined threshold, the tested chip can be discarded upon singulation of the wafer or possibly trimmed or tuned to bring about a better match between the laser source wavelength grid and the passband of AWG 20. Subsequently, during wafer singulation, portion 45 of the PIC 10A that includes photodetectors 40 can be cleaved from the chip along cleave line 44 and discarded.

In the embodiments of FIGS. 2 and 3, it should be realized that testing for the optimum vernier output includes the selective bias operation of one or more active optical components in the PIC during the testing phase. As an example, a selected laser source in an in-wafer PIC chip may be biased to test its output along with an applied bias to other active on-line components such as modulator 14 and photodetector 16 providing for their transparency of their laser source light. Their positive biasing, therefore, aids in permitting the laser source light to be tested at vernier outputs 23. Also, biasing of these other components can be employed to check to the component photoluminescence and determine if the waveguide core material bandgap is suitable or expected.

Also, importantly, it should be realized that testing for the optimum vernier output of a selected PIC, temperature on the wafer can be varied or the ambient local temperature of a laser source 12 under test can be varied via its associated laser source heater (not shown) by varying heater bias. By varying heater bias for each respective laser source 12 tested in an in-wafer PIC, the optimum vernier output can be selected based upon the laser sources operating at their substantially designated and desired operational wavelength through changes to heater bias. Examples of such laser source heaters and biasing can be understood from U.S. patent application, Ser. No. 10/267,330, supra.

Alternatively, photodetectors, such as some of the photodetectors 30 and 40 of FIGS. 2 and 3, may be deployed at multiple Brillion zone outputs of the AWG or only at higher order Brillouin zone outputs of the AWG for in-wafer measurements for the same purposes. Also, photodetectors 30 or 40 can be formed adjacent to the vernier outputs with optical taps directing a portion of their light from a corresponding vernier output to its corresponding photodetector. In this case, the photodetectors may remain as part of the singulated PIC chip and some of the photodetectors may be deployed for output signal monitoring during transmitter module testing, field testing or during transmitter module in-service usage. Also, it is within the scope of this invention to use the testing approaches for in-wafer photonic integrated circuits, as discussed relative to FIGS. 2 and 3 as well as to be discussed in connection with FIGS. 4 and 5, for PIC chips after wafer singulation. Further, as already previous indicated, it is within the scope of this invention to use these testing approaches in connection with PICs employing an optical combiner, such as a power coupler, a star coupler or MMI coupler, or other wavelength selective optical combiner, such as an Echelle grating or a cascaded Mach-Zehnder interferometers.

Reference is now made to FIG. 4 which should be considered as a combined embodiment of FIGS. 2 and 3 except that photodetectors 30 or 40 are formed in an adjacent PIC chip relative to a plurality of such PIC chips formed in a wafer. As shown in FIG. 4, photodetectors 30 or 40 are formed in TxPIC chip 10(1) and are employed for testing vernier outputs 23 of an adjacent TxPIC chip 10(2). Thus, when in-wafer testing is completed, as described previously, the utility of photodetectors 30 or 40 are no longer needed, i.e., in-wafer determination and selection of the optimum vernier output has been accomplished. Upon wafer singulation, the photodetectors remain dormant on the TxPIC chips.

Reference is now made to FIG. 5 which illustrates the same TxPIC chip 10 of FIG. 1 except that TxPIC chip 10C of FIG. 5 does not have vernier output photodetectors but includes at least one additional higher order or first order −1 and +1 Brillouin zone outputs 50 and 52 on either side of vernier outputs 23 that are formed along the zero order Brillouin zone output face 22A of output free space region 22. First order outputs 50 and 52 respectively have photodetectors 54 and 56 formed at their terminus used for in-wafer testing the AWG passband. The −1 BZ output at detector 54 is deployed to detect wavelengths that are shorter than expected indicating that the center of the wavelength grid passband of AWG 20 is offset to the −1 BZ side which, and if of sufficient shift offset, indicates that the passband of AWG 20 is misaligned relative to the laser source wavelength grid, in which case, chip 10B may have to be discarded during wafer singulation. On the other hand, if the offset is within acceptable tolerances, it is possible to predict that one of the vernier outputs closest to the −1 BZ side is most likely to be favored for an optimum vernier output from AWG 20 thereby eliminating the any further need to subsequently test those vernier outputs closest to +1 BZ output side for optimum output via detector 56. Conversely, the +1 BZ output at detector 56 may be deployed to detect wavelengths that are longer than expected indicating that the passband of AWG 20 is offset to the +1 BZ side which, and if of sufficient shift offset, indicates that the passband of AWG 20 is misaligned relative to the laser source wavelength grid, in which case, chip 10C may have to be discarded during wafer singulation. On the other hand, if the offset is within acceptable tolerances, it is possible to predict that one of vernier outputs closest to the +1 BZ side is most likely to be favored for an optimum output from AWG 20 thereby eliminating the need to subsequently test those vernier outputs closest to the −1 BZ output side for output side for optimum output via detector 54. In either case above, depending upon the degree of short or long wavelengths appearing on either the −1 BZ or +1 BZ side, respectively, such as through the use of a spectrum analyzer and/or a power meter, can be employed to predict which side verniers are likely to contain an optimum vernier output. In other words, the degree or amount of such shorter or longer wavelengths on a prediction scale can indicate which of the three vernier outputs of the seven vernier outputs, on either side of the central vernier output, is most likely the optimum vernier output.

By the same token, if the offset detected via photodetector 54 indicates low power output with a limited or no significant amount of short wavelengths, it is possible to predict that one of the vernier outputs closest to the +1 BZ side is most likely to be favored for an optimum output from AWG 20. On the other hand, if the offset detected via photodetector 56 indicates low power output with a limited or no significant amount of long wavelengths, it is possible to predict that one of the vernier outputs closest to the −1 BZ side are most likely to be favored for an optimum output from AWG 20. Thus, in all of these cases, it is possible to predict which of the output verniers of the several outputs, as measured from the central vernier(s), is most likely to be favored for coupled multiplexed signal output from chip 10C prior to wafer singulation. Upon wafer singulation, photodetectors 54 and 56 may be removed from chip 10C by cleaving chip portion 45 from the chip along cleave line 44. Alternatively, instead of integrated photodetectors 54 and 56 on chip 10B, the −1 BZ and +1 BZ outputs may be optically detected by off-chip photodetectors through optical coupling of their outputs from chip 10C.

Also, it is within the scope of this invention shown in FIG. 5 to use this testing approach for photonic integrated circuits in-wafer as well as out-of-wafer, after wafer singulation. Further, it is within the scope of this invention to employ the testing approach of FIG. 5 in connection with PICs employing an optical combiner, such as a power coupler, a star coupler or MMI coupler, as well as other wavelength selective optical combiners, such as an Echelle grating or a cascaded Mach-Zehnder interferometers. Also, it is within the scope of this invention to not cleave portion 45 from chip 10C but rather deploy photodetectors 54 and 56 in later testing or monitoring of the combined signal output from the PIC optical combiner such as described in U.S. patent application, Ser. No. 10/267,330, supra.

Reference is now made to FIG. 6 which illustrates two in-wafer RxPIC chips 24(1) and 24(2). In the case here, each RxPIC chip 24 comprises a wavelength selective decombiner, shown here as AWG demultiplexer 25, having a plurality of vernier inputs 26, an input free space region 27, a plurality of diffraction arms 28 and an output free space region 29. Channel signals are demultiplexed by AWG 25 from a combined channel signal input received at an optimum input vernier input 26 and the respective channel signals are provided to a photodetector 32 for conversion from an optical signal into an electrical signal. Ten such signal channels are shown although it should be readily understood that more of such channels may be included on a chip 24. More detail relating to RxPIC chips 24 is disclosed in patent application, Ser. No. 10/267,304, supra.

In FIG. 6 each in-wafer PIC chips 24(1) and 24(2) includes an array of broadband light sources 33 also integrated onto the chip. These light sources 33 are optically coupled, respectively, to vernier input waveguides 26 of an adjacent chip PIC, such as shown in the case here for PIC chip 24(2). Light sources 33 have a broadband spectrum which spans the wavelength range of the free spectral range (FSR) of AWG 25 or approximate the total wavelength bandwidth of the channels signals received by the PIC. Examples of such sources are Fabry-Perot lasers, superluminescent lasers, LEDs or forward biased photodetectors, such as PIN photodiodes.

Sources 33 on a neighboring PIC, such as RxPIC 24(1), are employed to verify the optical characteristics and functionality of the adjacent RxPIC 24(2) via its vernier inputs 26. By forward biasing sources 33, to generate light, such as ASE light, the photocurrent developed at photodetectors 32 may be accessed via appropriate test probes and employed to estimate or determine the integrity of AWG 25, associated input waveguides 26 and output waveguides 31 as well as the integrity of any butt joints or the contacts (not shown) of photodetectors 32. Sources 33 will not subsequently interfere with later on with RxPIC functionality since they reside with a neighboring RxPIC and are cleaved away after in-wafer testing. The structure of sources 33, for example, could be the same fabrication structure as photodetectors 32 but are forward biased to provide light output during their use in in-wafer testing. The use of such in-wafer light sources 33, as well as photodetectors 30 and 40 discussed in previous embodiments, establish a screening criteria for checking the integrity and operability of integrated active and passive optical components in separate PICs that are still un their in-wafer form thereby saving appreciable test time and resource costs that would be encountered if the PIC chips were, first, singulated from the wafer and thereafter properly mounted to undergo testing on a one-by-one basis.

Reference is now made to FIGS. 7 and 8 and the deployments of materials for planarizing and passivating the active and passive optical components formed in a PIC. The particular example shown here is for wavelength selective decombiner 25. However, it will be understood by those skilled in the art that passivation and planarization to be described relative to FIG. 7 is equally applicable to other types of PIC chips including, but not limited to, TxPIC, transceiver photonic integrated circuit (TRxPIC) chips or SMLs. Shown in FIG. 7 is a wavelength selective decombiner comprising AWG 25. The surface of AWG 25, as well as the surface of the RxPIC chip, are isolated and passivated with a medium formed over the surface of the PIC. Such materials may be also employed for planarizing and passivating RxPIC chips too. A preferred choice for such a medium is the material, BCB (benzocyclobutene polymer), which is advantageous in that it provides (1) a very low stress, for example, about 20 to 30 MPa, (2) planarization with a dielectric constant of about n=1.6, which dielectric constant is between air=1 and InP having a dielectric constant of about n=3.2, and (3) an ability to easily planarize as-grown semiconductor structures. Consequently, BCB may be utilized to environmentally, electrically and optically passivate AWG 25. Furthermore, BCB can be easily patterned after it has been planarized. Also, $SiO_x$, $SiN_x$ and $Si_xON_y$ are also alternatives but BCB is preferred because of its low stress properties and ability to easily planarize. By planarization herein, we mean that the topography of the integrated components across the PIC, such as active and passive optical components including ridge waveguides, are covered with the medium which may be made thereafter more uniformly planar by an etchback, for example. However, it does not mean or necessarily entail that PIC planarized surface is perfectly or essentially flat.

Such a BCB medium may be patterned over RxPIC AWG 25 in FIG. 7 to produce a polarization insensitive device. In this connection, note that in FIG. 7, a portion of the BCB overlayer 60 is patterned in a region at 62 by removing a portion of the spin-on BCB material in this region to provide for a balance in the TE to TM mode ratio through a change in birefringence (Δn) along the length of the AWG diffraction grating arms 28. As is known, the TE mode propagates faster than the TM mode through waveguides 28 causing polarization mode dispersion (PMD). By reducing the thickness of the overlayer 60 of BCB in a patterned region over waveguides 28, such as indicated by a patterned region 62, the refractive index is lowered in this region due to a reduction of the BCB thickness so that the velocity or speed of TM mode of the propagating light will increase and can be selectively made, by the adjustment of the size and depth of region 62, to match the velocity or speed of the TE mode because of the relationship of, V/n, where V is the velocity of the TE mode and n is refractive index of the overlying layer of BCB. The pattern size is changed and the depth of BCB overlayer removal is chosen so as to achieve polarization insensitive performance defined by the TE-TM wavelength shift being approximately less than or equal to 20% of a magnitude of the channel spacing. The pattern 62 is shaped such that a change in depth of BCB thickness is of the greatest length along the shortest arm 28(1) and monotonically decreases in length of BCB thickness reduction at the longest arm 28(N) as shown in FIG. 7.

It should be noted that for AWG 20 in TxPIC chip 10, such patterning may not be necessary because the strain of the In-based deposited layers may be utilized to substantially fix the polarization mode, and chip 10 and the waveguide channels comprising AWG 20 are not large enough to permit randomizing of the polarization modes. However, the patterning process can be utilized in PIC implementations where polarization mode dispersion (PMD) is sufficiently significant. The patterning region 62, therefore, has more application to an RxPIC chip 24 of FIG. 6 or in a TRxPIC because scattering centers in the optical transmission fiber randomize the TE and TM polarization modes of the multiplexed channel signals one into the other.

With reference to FIG. 8, the magnitude of the refractive index step between a free-space region 64 and waveguides 66 can contribute significantly to insertion loss of an optical coupler or a free space region in an AWG. In this connection, $$\Delta n \approx |n_{clad} - n_{fs}|$$

where $n_{clad}$ is the effective refractive index of the material forming the cladding overlayer, such as BCB, and $n_{fs}$ is the effective refractive index of the free space region 64. By effective refractive index, we mean the effective index profile through the deposited semiconductor layers in the region of the cladding adjacent to the waveguide core and the effective index profile through the deposited semiconductor layers in the region of the free space region. The smaller the Δn, the lower the insertion loss of the coupler. In a buried InP waveguide structure, $n_{clad}$ is approximately 3.3, making Δn small and, hence minimizing its contribution to insertion loss. In a ridge-waveguide structure, such as seen in FIGS. 8A and 8B, for example, $n_{clad}$, is significantly lowered by the presence of air (n=1), making the Δn contribution to the insertion loss more significant. However, this increased contribution to Δn can be reduced by employing a higher refractive index material, for example, BCB where n is approximately 1.6, or employing ZnS where n is approximately 2.2, or employing ZnSe where n is approximately 2.4.

As shown in FIGS. 8A and 8B, a cross-section of one of the several ridge waveguides 48 leading to a free space region 46 of an optical combiner/decombiner may be comprise, for example, of an InP alloy system comprising an InP substrate 70 upon which is deposited a lower cladding layer 72 of InP, followed by a waveguide core 74 comprising, for example, AlInGaAs or InGaAsP, followed by an upper cladding layer 75 of InP. To form a ridge waveguide 46, an etchback is performed a shown in the art. Then, a passivating layer 77, such as BCB, is deposited over a formed ridge waveguide 76A and 76B of the multiple waveguides 48 as seen in FIGS. 8A and 8B.

With respect to FIG. 8A, ridge waveguide 76A is a shallower ridge with thinner cladding layers 72 and 75, for example, so that a portion or evanescent tail of the propagating mode 79 of the signal light extends into passivation layer 77. The effective refractive index as experienced by the mode 79 in waveguide 76A can be altered by reducing the thickness of passivation layer 77 as indicated by arrow 78 over waveguide 76A thereby changing the center wavelength of the combiner/decombiner relative to the center of the passband thereof so that the center wavelength of a group of wavelengths, such as channel wavelengths, in waveguides 48 are substantially aligned to the center of the wavelength passband of the optical combiner/decombiner.

With respect to FIG. 8B, ridge waveguide 76B is much deeper wherein cladding layers are sufficiently thick to fairly well contain the evanescent tails of propagating mode 79. In this case, the effective refractive index experienced by mode 79 can be altered by reducing the thickness of BCB layer 77 to a depth, for example, below the top of ridge waveguide 76B as seen at 71. In either case of a shallow or deep ridge waveguide 76A or 76B, the effective refractive index experienced by mode 79 can be changed thereby changing the center wavelength of the combiner/decombiner relative to the center of the passband thereof so that the center wavelength of a group of wavelengths, such as channel wavelengths, in waveguides 48 are substantially aligned to the center of the wavelength passband of the optical combiner/decombiner.

The foregoing is also applicable to optical multiplexers/demultiplexers such as AWGs. The patterning of the overlayer of BCB may be utilized to improve or tune the wavelength response of an AWG or coupler as well as adjust the power in the waveguide input side, such as power equalization among different channels, and reduce insertion loss by reducing the index step to the free space region of an AWG or to a coupler. An improvement approach is to have the BCB cladding layer increase in thickness over the waveguides 48 progressively toward free space region 46. This reduces the effective refractive index step along the transition region which in turn reduces the effective reflection at the free space region connection which reduces the insertion loss of the AWG or coupler.

The step for the purpose of reducing the BCB overlayer thickness to achieve center wavelength alignment may have to be repeated until the desired thickness is achieved providing optimum center wavelength alignment to the free space region 46. a method of accomplishing center wavelength alignment of an AWG in a TxPIC, for example, is as follows. First, the entire PIC chip or a wafer of such chips is passivated with a low stress overlayer of BCB or other mentioned passivation materials, such as $SiN_x$, in particular $Si_3N_4$. Next, the active component region of the PIC chip, such as modulated sources comprising modulated laser sources or laser sources with electro-optic modulators and any PIC associated photodetectors, are masked with a material that is resistant to an RIE etch to be deployed to etch the passivation overlayer present in the AWG region. Next, if the passivation has been done on the wafer level, the wafer is singulated into PIC die which then individually attached to a submount. Next, a measurement is taken of the alignment of the center wavelength of laser source wavelength grid to the AWG wavelength grid and passband through the employment of the photodetectors in the previous embodiments and/or with spectrum analyzer. If there is a misalignment of the center wavelength of these two grids, PIE is applied to the exposed region of the chip comprising the AWG region (note that the active region of the chip remains protected) and etch the passivation over layer of $Si_3N_4$ or BCB. Next, a measurement is again taken to check the alignment of the center channel wavelength of the laser source wavelength grid to the AWG wavelength grid. If the alignment is better, but still off, the above mentioned RIE step and re-measurement steps are repeated until there is substantial alignment of the grids.

The above process can also be practice by only cladding the passivation layer over the AWG region and mask the unpassivated active component region of the chip. Also, it is advantageous to apply this method on the chip level rather than the wafer level because correction for processing variations in the epitaxial growth across the wafer, which effects the effective refractive index, can be compensated for by processing the cladding overlayer of the individual chips and tune the effective refractive index across the AWG to achieve center channel wavelength alignment of the wavelength grid of the laser sources with that of the AWG. Center wavelength tuning, for example, may be used to tune approximately 0.24 nm by varying the thickness of a $Si_3N_4$ passivation overlayer by about 1000 Å.

Many complex waveguide structures have been proposed in the art, such as exemplified in the J. H. den Besten et al article, supra, to lessen the effective refractive index change at a ridge waveguide to free space transition region of an optical coupler. We have discovered a simple approach which is to alter the channel or groove depth between ridge waveguides or the channel, or groove side wall angle of the ridge waveguides, or both, leading to the transition point between the waveguides and a free space region as illustrated in FIGS. 9–11. In FIGS. 9–11, there is illustrated a free space region 50 having a plurality of input ridge waveguides 52 coupled at one side of free space region 50 and a plurality of formed output ridge waveguides 54 coupled to region 50 at opposite side. A channel, trench or groove 56 is formed between each set of waveguides 52 or 54, as best seen in FIGS. 10 and 11, having a V-shaped side wall bottom portion 58. As shown in both FIGS. 10 and 11, the ridge waveguide structure for waveguides 52 or 54 may be comprised of an InP substrate 80 upon which are deposited a plurality of InP-based layers, employing MOCVD, comprising, for example, in sequence, n-InP confinement layer 82, core waveguide region 84 comprising either InAlGaAs or InGaAsP, p-InP confinement layer 86, upper guide layer 88 of either InAlGaAs or InGaAsP, and upper cladding layer 90 of p-InP. It should be noted that layers 82, 86 and 90 are shown as having a conductivity type. This is because these waveguides are part of layers, for example, forming the active components 12, 14 and 16 on TxPIC chip 10, for example. Thus, it is within the scope of this invention to form a core waveguide, InP-based structure without such conductivity types. Also, the channels or trenches 56 need not have V-shaped bottoms 58 but may have flatter shaped bottoms. Also, it is within the scope of this invention that the V-shaped trench structure shown in FIGS. 10 and 11 may be formed in other material bases, other than In-based materials, such as a silicon substrate with silica or $SiO_2$ waveguide core structures formed on the silicon substrate as known in the art.

To be noted in a sequence from FIGS. 10 and 11, bottom 58 of trenches or channels 56 become monotonically shallower in their progression toward free space region 50. This progressional change can also be seen in FIG. 9. Thus, trenches or channels 56 monotonically become shallower or diminish toward free space region 50 providing an adiabatic, monotonic change in refractive index as seen by the propagating light within the waveguides and terminating in an optically coupled relationship with adjacent waveguides at or near a refractive index, $n_{fs}$, at the edge of free space region 50. This optically coupled region with adjacent waveguides and the edge of free space region 50 is referred to as the transition region. Such a monotonically shaped structure provides for a smooth adiabatic transition between waveguides 52 or 54 and free space region 50 and thereby provides for significant reduction in insertion losses at the waveguide/free space region interface region. FIGS. 10 and 11 clearly exhibit the monotonic extinsion of the V-shaped groove bottoms of trenches 56 leading up to free space region 50.

It should be noted in this embodiment that is necessary is a monotonic reduction in the depth of trenches 56 between the waveguides 52 or a monotonic change in the channel side wall angle, such becoming more aligned to the horizontal, or a combination of both, in order to achieve an adiabatic waveguide for propagating signal light resulting in achieving the lowest insertion loss.

Trenches 56 are formed by a two step etching process using the same single mask for both etching steps, unlike the two step etching process of J. H. den Beston et al, supra, which requires at least two different masks for two different etching steps. In forming trenches 56 in FIGS. 9–11, the first etching step through upper cladding layer 52 and upper guide layer 88 is accomplished with an anisothropic etch to a first depth followed by an isotropic etch to a second depth using the same mask set for each etching set. The anisothropic etch, for example, may be a dry etch, such as $H_2$, $CH_4$ and Ar gas. The isotropic etch may be a wet etch, such as 10:1:1 mix of $H_2O:H_2O_2:H_2SO_4$. The first depth may be defined by the thickness of upper cladding layer 52 and the second depth may defined by a partial thickness of upper guide layer 88.

It should be importantly noted that the embodiment of FIGS. 9–11 is not limited to free space regions such as employed in AWG components, such as shown in FIG. 7. The technique can also be deployed with other devices having diverting or converting optical free space regions with accompanying input and output waveguides such as power couplers, star couplers, MMI couplers or Echelle gratings. Also, this technique can also be applied to silicon-based devices having diverting or converting optical free space regions with accompanying input and output waveguides employing, of course, different etchants, which etchants are known in the art.

Reference is now made to FIGS. 12 and 13 which illustrate a further embodiment for reducing insertion loss in the transition region between ridge waveguides and a free space region such as illustrated in the previous embodiment. As shown in FIGS. 12 and 13, a combination of passivation overlayers is deployed in connection with ridge waveguide 96. In FIG. 12, a cross-section of the waveguide is illustrated out farther from the free space region, such as, for example, at the position of line 10—10 in FIG. 9. In FIG. 13, a cross-section of the waveguide is illustrated closer to the free space region, such as, for example, at the position of line 11—11 in FIG. 9. Ridge waveguide 96 in these figures comprises an InP substrate 90 upon which is epitaxially deposited a lower cladding layer 92 of InP, waveguide core region 94, which may be InGaAsP or AlInGaAs, and an upper cladding layer of InP. After a selective etch to form ridge waveguide 96, a dielectric layer 97, such as $SiN_x$, $SiO_x$ or $Si_xON_y$, (x, y$\geq$0) is deposited or other such passivating material is formed, such as by CVD or other known method, followed by spin-on BCB 98. Layer in this embodiment as well as later embodiments may also be ZnS or ZnSe. The deposition of dielectric layer 97 provides for better adhesion for the following passivation layer 98 as well as provides for gradual change in the effective refractive index surrounding waveguide 96. To be noted is that dielectric layer 92 monotonically increases in thickness as shown in FIG. 12 at 99A to a larger thickness depicted at 99B in FIG. 13. Thus, dielectric layer is deposited such that it monotonically becomes thicker as it progresses toward a coupled free space region thereby gradually changing the effective refractive index profile to achieve the lowest insertion loss. Do to this gradual change in thickness of dielectric layer 97, the effective refractive index of layers 92, 97 and 98 will provided lower insertion loss by adiabatically increasing the effective refractive index as experienced by the propagating signal light in waveguide 96. The resulting effect is the easement of the effective index step between narrow waveguide 96 and a larger free space region. The exemplary layers here are BCB layer 98 with n approximately equal to 1.6, dielectric layer 96 with n in the range of about 1.8 to 2.0 and cladding InP layer 92 with n of about 3.5.

As previously indicated, the propagation loss of the ridge waveguides deployed in an AWG contributes significantly to insertion loss. In a ridge waveguide AWG, the AWG is typically defined by anisotropic dry-etching to prevent any crystallographic etching that is commonly encountered in using wet etches. This is desired since the waveguide in an AWG cannot be restricted to lie along a single crystal axes. A consequence of the dry etching process is that the side walls of the etched waveguide exhibit a finite characteristic roughness. This roughness, as known in the art, can contribute to increased scattering loss which increases the propagation loss and, hence, the insertion loss of the AWG. This scattering loss is a function of the surface roughness (the size and density of the fabricated structural features) and the refractive index step between the waveguide and the overlayer of cladding material. In a buried InP waveguide structure, the cladding material is InP, rendering this effect relatively small. In a ridge InP waveguide structure, the effect is magnified as a result of the relatively large index step between air (n=1) and the InP-based waveguide material (n~3.3). The net effect of insertion loss due to the side wall roughness of any ridge waveguides deployed in a PIC can be minimize by employing a comparatively higher index cladding material, such as, BCB, where n ~1.6. In this connection, reference is again made to FIG. 14 illustrating the deployment of BCB or ZnS or ZnSe in an AWG ridge waveguide structure. However, it should be understood that BCB may be used in connection with any other optical active or passive component for passivation and planarization such as previously explained in connection with TxPIC chip 10 in FIG. 1. Also, as previously indicated, such passivation and planarization with these materials can be applied to RxPIC chips 24 shown in FIG. 6.

In FIG. 14, the illustrated waveguide structure comprises an InP substrate 90 upon which is deposited lower cladding layer 92 of InP, waveguide core layer 94 comprising, for example, InGaAsP or AlInGaAs, and upper cladding layer 95 of InP. Then, to form a ridge waveguide, layers 94 and 95 are etched back with a mask over the ridge to be formed, e.g., using an anisothropic etch, resulting in ridge waveguide structure 94. This structure may then be passivated with a comparatively high refractive index material that also provides for good planarization. The materials of choice, as previously indicated, are shown in FIG. 14 comprising BCB, ZnS or ZnSe. After application of this passivation layer 98, the layer may be planarized to the surface depth of the top of optical component features across the topography of the chip or PIC or, alternatively, to a predetermined height above the top of such features. If layer 98 is planarized to the top of such features, optionally, an overlayer 99 may be provided on the surface of passivating layer 98, such as $Si_3N_4$, $SiO_2$, $Si_xON_y$, polyimide or one of the materials for passivating layer 98 or any other organic or inorganic resin materials. Also, materials such as $SiO_x$, $SiO_x$, $Si_xON_y$ or polyimide may be provided as a layer between lower cladding layer 92 and passivation layer 98, such as illustrated in FIGS. 12 and 13.

Planar device geometries are important in minimizing fabrication complexity. Geometries make the fabrication of complicated device structures difficult, for example, making circuit contacts to non-planar devices or features in a PIC chip are much more difficult than contacting to a planar device. BCB is a mechanism that allows optical ridge type components that are inherently non-planar, as in the case of ridge waveguides or ridge SMLs, to be planarized as described herein.

Planar geometries for AWGs may be important for a variety of reasons. In a PIC, an AWG may be integrated with other optical components, for example, lasers, modulators, optical amplifiers, and/or detectors. It is highly desirable to have planar geometries on as-grown PICs or devices to help form contacts, routing to connections and interconnections, etc., in such PICs or devices. Thus, BCB, ZnS, or ZnSe may be advantageously employed to passivate and/or planarize such devices or PICs which particularly include either or both active or passive components such as a laser source or an AWG device. Furthermore, planarization of the AWG can provide a planar surface wherein an element can be placed over the BCB to serve as a heater or other PIC function to tune the AWG or adjust, for example, its polarization insensitivity. Additionally, if the BCB is made sufficiently thick over an AWG so as to be an electrically isolating, this will allow the routing of electrical signals, such as via metal interconnect lines, over the AWG without affecting its optical performance.

BCB is advantageous in that it provides a low-stress planarization material. However, it is not stress free and does not necessarily provide complete environmental or electrical passivation. In order to improve these properties, BCB may be combined with other dielectric passivation materials, for example, $SiN_x$ or $SiO_x$ as exemplified in FIGS. 12 and 13 as well as shown in FIG. 15. In FIG. 15, there is illustrated a ridge waveguide 96 with waveguide core 94 in the ridge, as in the case of FIGS. 12 and 13 except an initial and comparatively thin, first type, passivation layer 97(1) of $SiO_x$, $SiN_x$ or $Si_xON_y$ or other such passivating material is formed, such as by CVD or other known method, over the etched surface of lower cladding layer 92 and ridge waveguide 96, followed by the deposition of a second type, passivating layer 98(1) of BCB or ZnS or ZnSe. Next, this is followed by the deposition of a first type, passivating layer 97(2) followed by a second type, passivating layer 98(2) and so on. The alternating combination of these two layers provides for combined adhesion as well as improved combined passivation. The deployment of alternating layers 97 and 98 directly on top of ridge waveguide 96 itself is optional, i.e., they can be extended only to be adjacent to waveguide ridge 96. However, if positioned as shown in FIG. 15, they provide for enhanced passivation.

An advantage of employing this alternating BCB/dielectric covering technique shown in FIG. 15 is also believed to improve the adhesion of BCB to the AWG layers with the presence of an intermediary dielectric layer 97(1).

BCB is also advantageous in that it is possible to cleave an InP-based PIC chip with a BCB cladding overlayer, upon wafer singulation, without affecting the qualities of the resulting cleave. However, this property does not hold as the thickness of the BCB passivation/planarization increases, for example, for thicknesses approximately equal to or greater than around 2 μm. For thicker BCB layers, it is desirable to define linear "cleave streets" in the BCB as illustrated at 100 in FIG. 19, down through the entire thick BCB layer 98 or at least to within about 2 μm of InP layer 95. The thick BCB layer 98 is at least partly removed or reduced in thickness in regions on the wafer where die cleaves are to be made, represented by dotted cleave line 102, forming linear troughs or grooves 100 in the thick BCB layer 98. This technique improves the cleave quality without significantly affecting the benefits afforded by the employment of BCB as a passivation and planarization material. The same is true for the materials, ZnS and ZnSe.

It could be noted that the kind of ridge waveguides that may be utilized in the practice of this invention include (a) deep-ridge, (b) shallow-ridge, and (c) rib-loaded slab geometries which are respectively illustrated in FIGS. 16, 17 and 18. As shown in these ridge waveguide devices, BCB is provided to the non-planar spaces beside or between the ridge waveguides. Optionally, the BCB may also cover the waveguide structures as illustrated at 99. Instead of BCB, either ZnS or ZnSe can be employed for such planarization and/or passivation.

With reference to FIG. 16, the waveguide structure shown is a deep-ridge waveguide 96A, similar to that shown in FIG. 14. The ridge waveguide structure shown in FIG. 17 is a shallow-ridge waveguide 96B. To be noted in FIG. 17 is that the waveguide core 94A is not part of the ridge, as it is in the case of FIG. 16, but is part of the bulk or slab. The ridge waveguide 96B includes only upper cladding layer 96. Index guiding is provided by the proximity of ridge 96B to the propagating mode.

The waveguide structure shown in FIG. 18 is a rib-loaded slab waveguide 96C and comprises a slab waveguide 94A such as InGaAsP Or AlInGaAs formed between confinement layers 92 and 92A of InP. Waveguide 96C includes a higher index rib guiding layer 93, for example, of InGaAsP or AlInGaAs and upper cladding layer 95 of InP. Waveguide 96C provides for greater optical mode confinement.

All of the ridge waveguides 96A, 96B and 96C of FIGS. 16–18 are shown passivated with a layer 98 of BCB with an optional overlayer 99 of BCB that may be provided with some planarization. Planarization in all embodiments here may be accomplished, for example, by RIE.

While the invention has been described in conjunction with several specific embodiments, it is evident to those skilled in the art that many further alternatives, modifications and variations will be apparent in light of the foregoing description. For example, beside the deployment of InGaAsP/InP regime, described relative to the structures for an AWG disclosed in this application, the InGaAs/InP regime or the InAlGaAs/InP regime can also be deployed in this invention as the material structures for the AWG with passivation and/or planarization with BCB. Also, the deployment of BCB, ZnS or ZnSe in this invention need not be limited to AWGs but can also be applied to other active or passive components as discrete devices or as integrated in an optical circuit such as Group III–V semiconductor photonic devices and PICs and silicon-based photonic devices and PICs. Also, it is within the scope of this invention of employing other dielectric or fill materials, other than BCB, ZnS and ZnSe, such as polyimides, acryls, polyamides, or polyimide-amids, or other applicable organic or inorganic resin materials where the refractive index is suitable for the particular PIC or device application in leading to lower insertion loss. Also, the planarization and via process deployed in this invention may also be deployed in electrical integrated circuits (ICs), other than photonic integrated circuits such as those employing silicon-based technology, so that the invention claimed herein is not just limited to photonic integrated circuits which are shown in the several embodiments herein for the purposes of illustrating the invention. Also, as known in the art, the p and n type conductivity of the Group III–V cladding, confinement and contact layers can be reversed. Thus, the invention described herein is intended to embrace all such alternatives, modifications, applications and variations as may fall within the spirit and scope of the appended claims.

What is claimed is:

1. A method of in-wafer testing of a photonic integrated circuit (PIC) which includes a plurality of modulated sources each having a different operational wavelength on a predetermined wavelength grid and an optical combiner having a predetermined wavelength grid and passband to combine the wavelength outputs from the modulated sources, comprising the steps of:

providing a plurality of vernier outputs from the optical combiner at a zero order Brillouin zone of the optical combiner, providing a higher order Brillouin zone output from the optical combiner on adjacent sides of the zero order Brillouin zone;

detecting the output from at least one of the higher order Brillouin zone outputs to determine if there is an offset between of the modulated source wavelength grid and the passband of the optical combiner.

2. The method of claim 1 wherein the step of detecting is carried out by photodetectors integrated with the PIC and coupled to receive the higher order Brillouin zone outputs from the optical combiner.

3. The method of claim 2 further comprising the steps of:

singulating the wafer into a plurality of photonic integrated circuit chips; and removing the photodetectors from the chip.

4. The method of claim 3 wherein the step of removing comprises the step of cleaving the photodetectors from the chip.

5. The method of claim 3 wherein the step of removing comprises the step of cleaving away an adjacent PIC chip containing a detector array for its neighboring PIC chip.

6. The method of claim 1 wherein the steps of detecting are performed on a photonic integrated circuit chip after singulating the wafer into a plurality of photonic integrated circuit chips.

7. The method of claim 6 comprising the further step of cleaving the photodetectors from the chip after the completion of testing.

* * * * *